(12) United States Patent
Mori et al.

(10) Patent No.: US 6,376,879 B2
(45) Date of Patent: *Apr. 23, 2002

(54) SEMICONDUCTOR DEVICE HAVING MISFETS

(75) Inventors: Seiichi Mori, Tokyo; Toshiharu Watanabe, Yokohama; Masataka Takebuchi, Yokosuka; Kazuaki Isobe, Yokohama, all of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/327,517

(22) Filed: Jun. 8, 1999

(30) Foreign Application Priority Data

Jun. 8, 1998 (JP) ............................. 10-159205
Feb. 24, 1999 (JP) ............................. 11-046728

(51) Int. Cl.$^7$ .......................... H01L 29/78; H01L 33/00
(52) U.S. Cl. ..................... 257/347; 257/349; 257/346
(58) Field of Search ................. 257/347, 346, 257/349

(56) References Cited

U.S. PATENT DOCUMENTS 5,827,747 A * 10/1998 Wang et al.
6,018,184 A * 1/2000 Becker
6,107,642 A * 8/2000 Sundaresan

* cited by examiner

Primary Examiner—Stephen D. Meier
(74) Attorney, Agent, or Firm—Banner & Witcoff, Ltd

(57) ABSTRACT

A first side-wall film is formed on the sides of a gate electrode of a high-voltage transistor, and a second side-wall film is provided on the first side-wall film. The first side-wall film has an etching rate lower that of a pre-metal dielectric, and the second side-wall film has an etching rate substantially equal to that of the of the pre-metal dielectric. The LDD of the high-voltage transistor is provided in that part of the semiconductor substrate which lies right below the first and second side-wall films. The source/drain diffusion layer of the high-voltage transistor is formed in that part of the substrate which is outside the second side-wall film. A first side-wall film having an etching rate lower than that of the pre-metal dielectric and/or a second side-wall film having an etching rate substantially equal to that of the pre-metal dielectric are provided on the sides of the gate electrode of the low voltage transistor. The LDD of the low voltage transistor is provided in that part of the substrate which lies right below the first side-wall film. The drain/source diffusion layer of the low voltage transistor is provided in two continuous parts of the substrate which lie, respectively, right below and outside the second side-wall film.

41 Claims, 25 Drawing Sheets

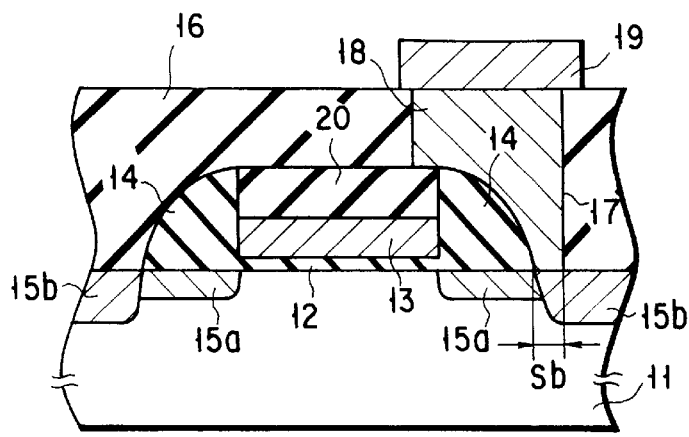
FIG. 4 (PRIOR ART)
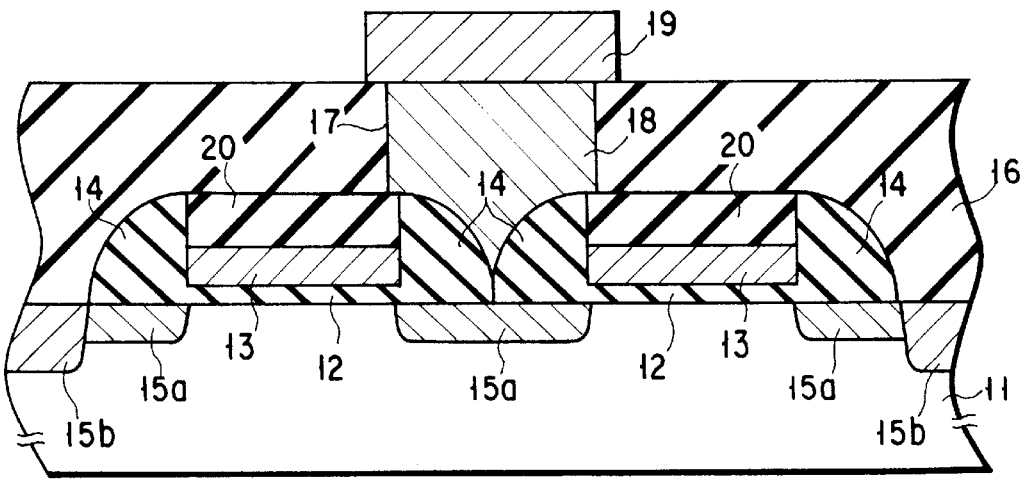
FIG. 5 (PRIOR ART)
FIG. 6 (PRIOR ART)

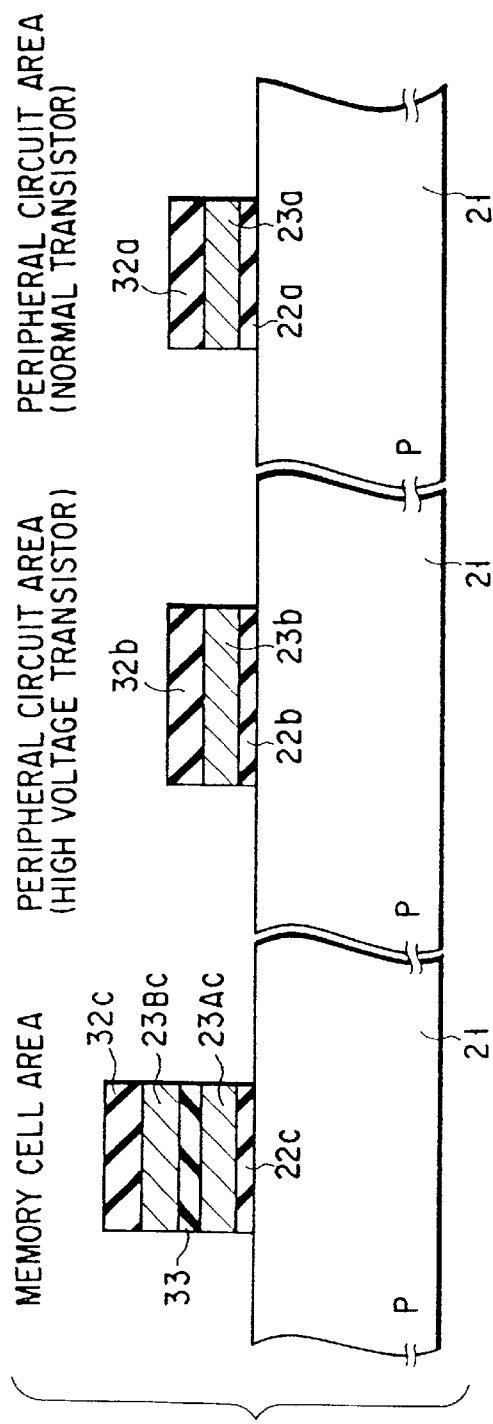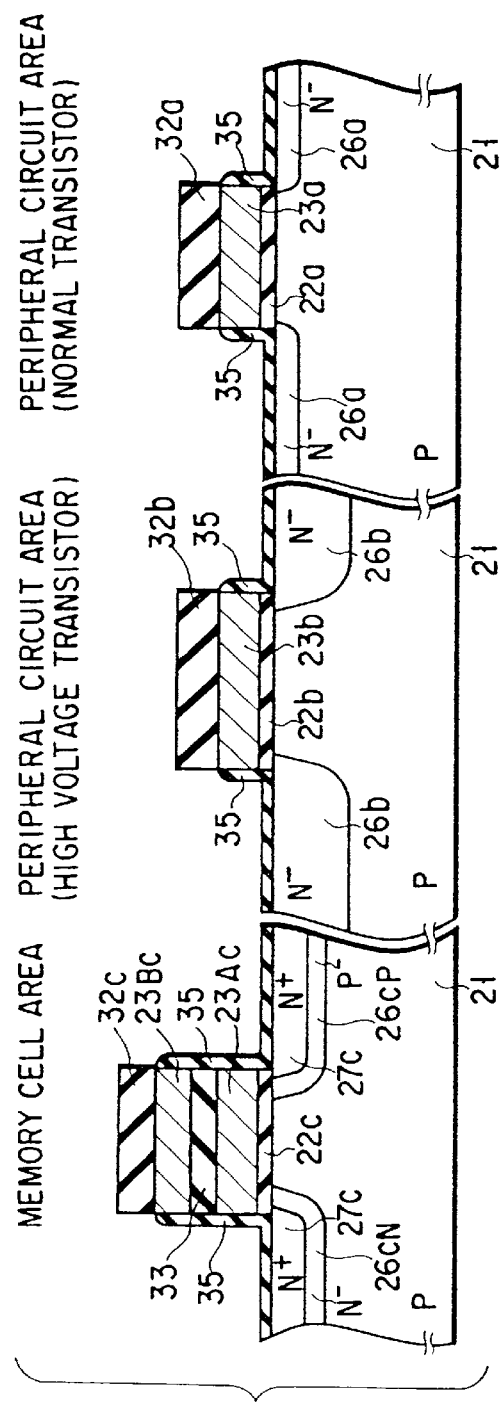
F I G. 11
F I G. 12

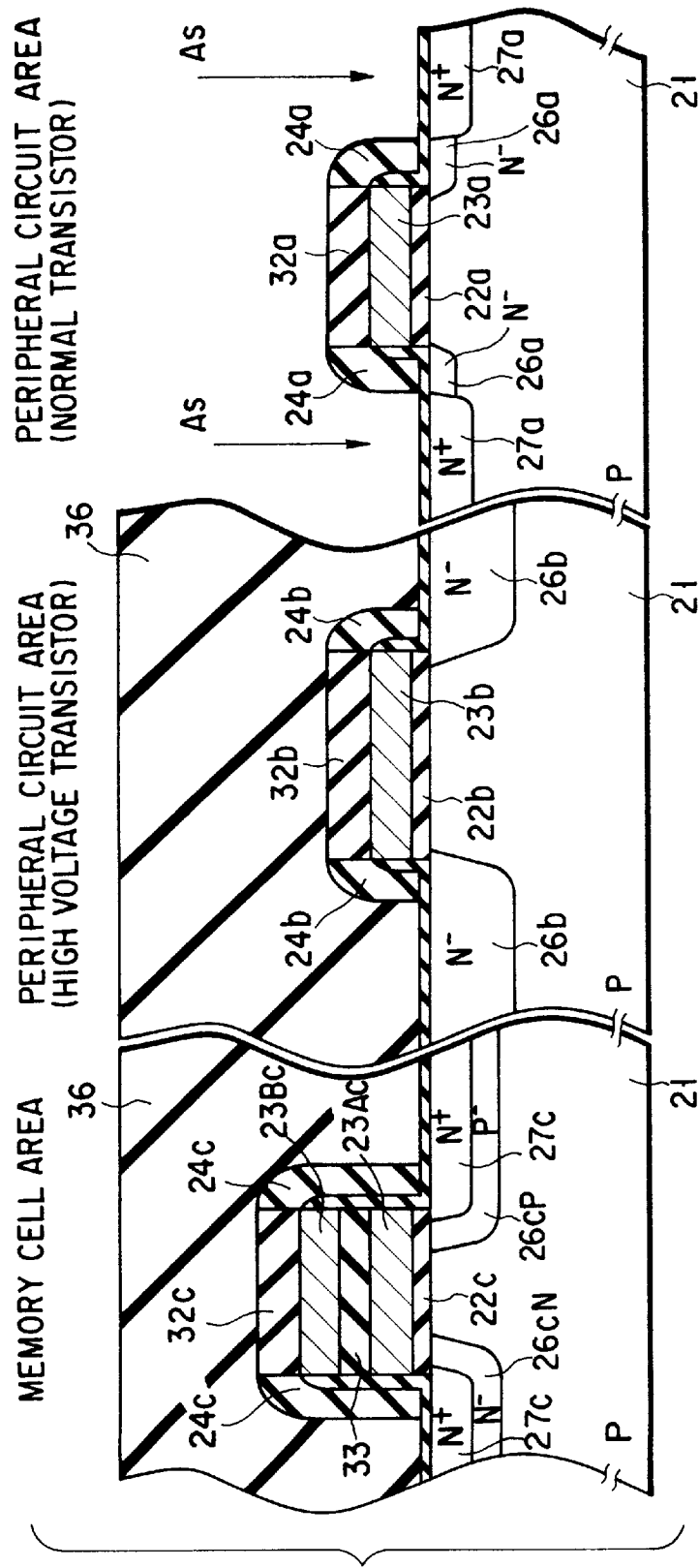
F I G. 15

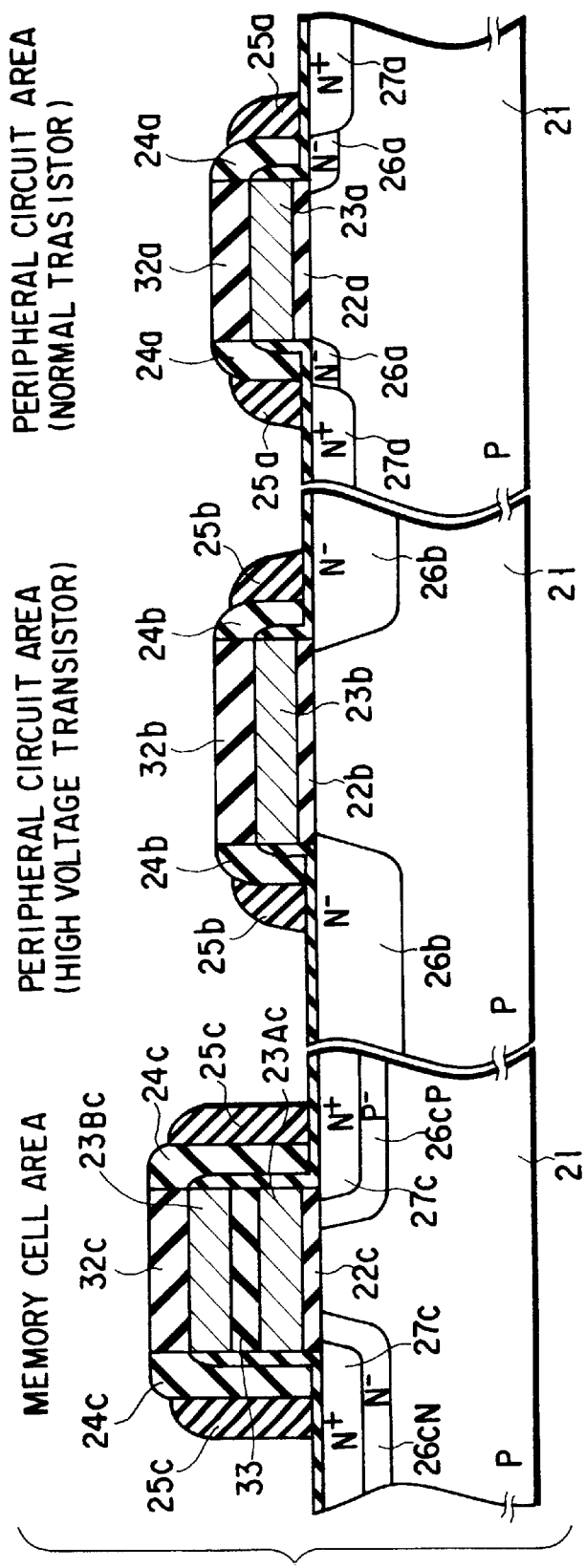
F I G. 16

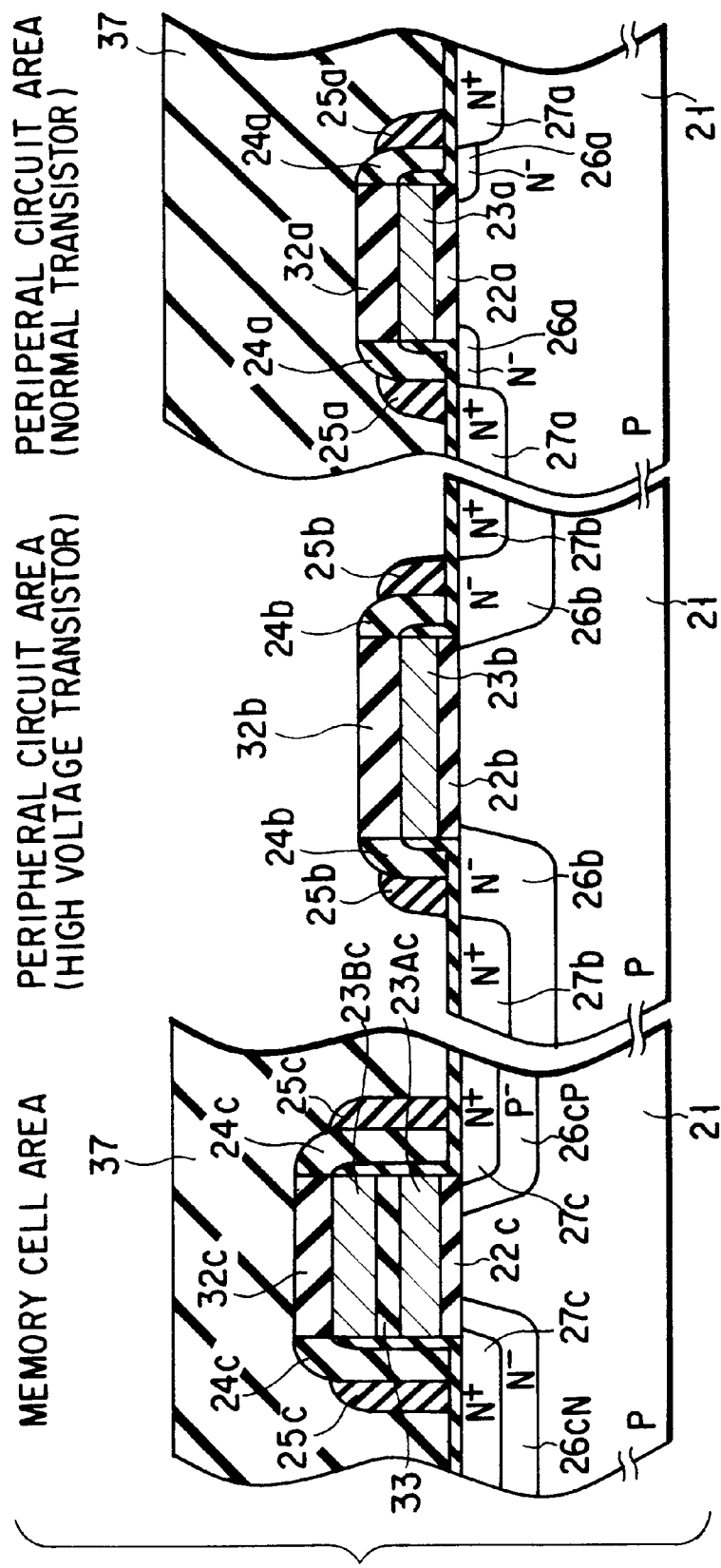
F I G. 17

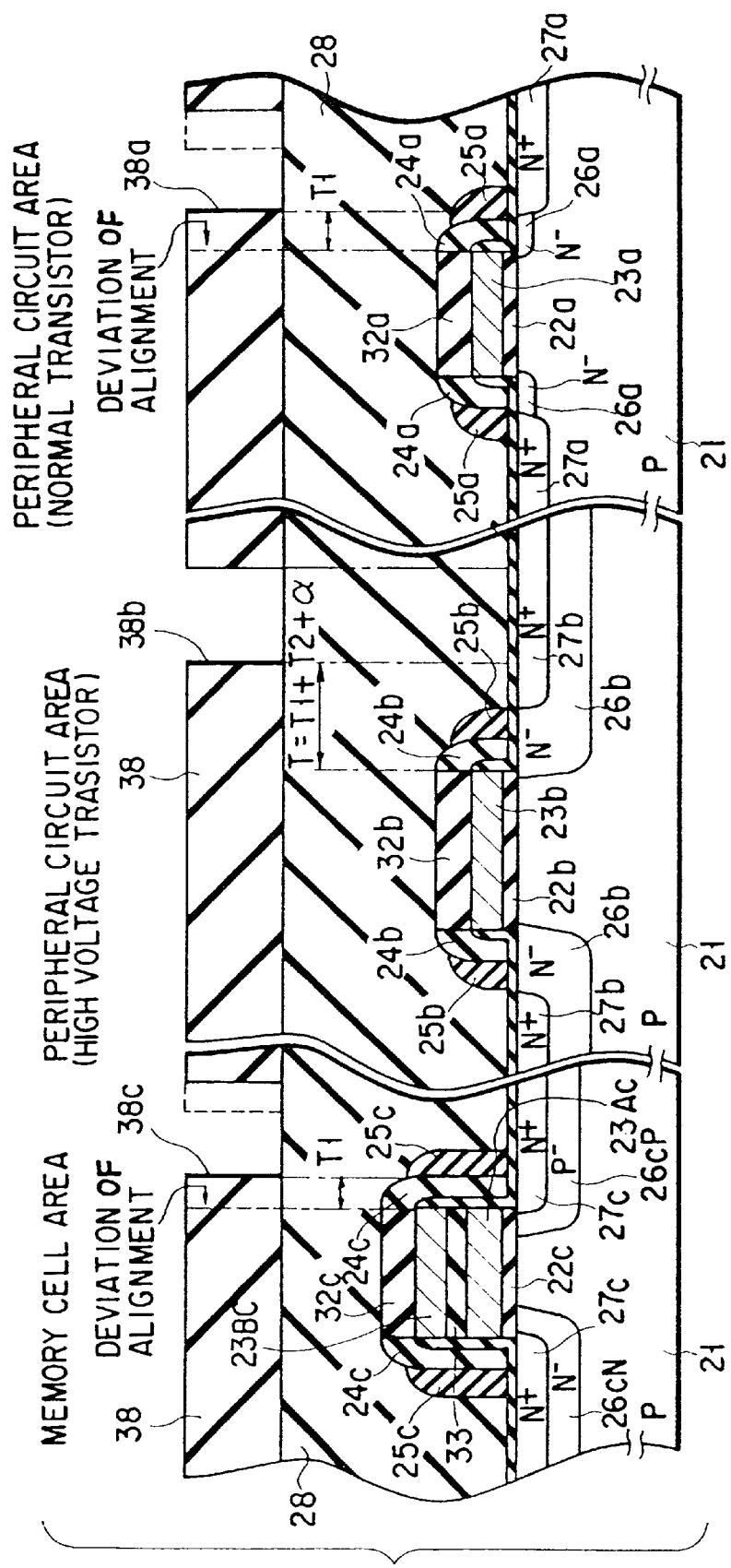
F I G. 18

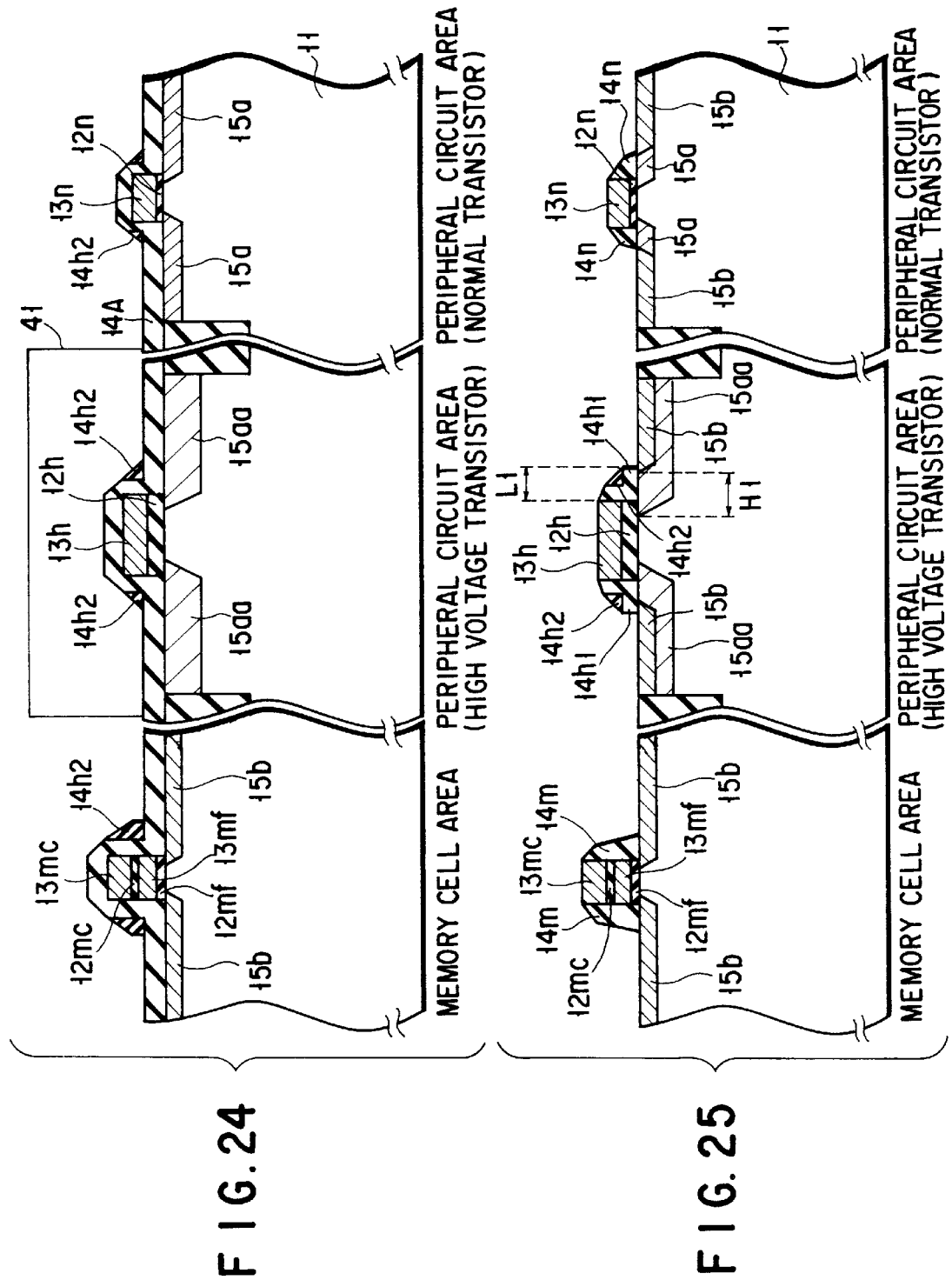
F I G. 24
F I G. 25

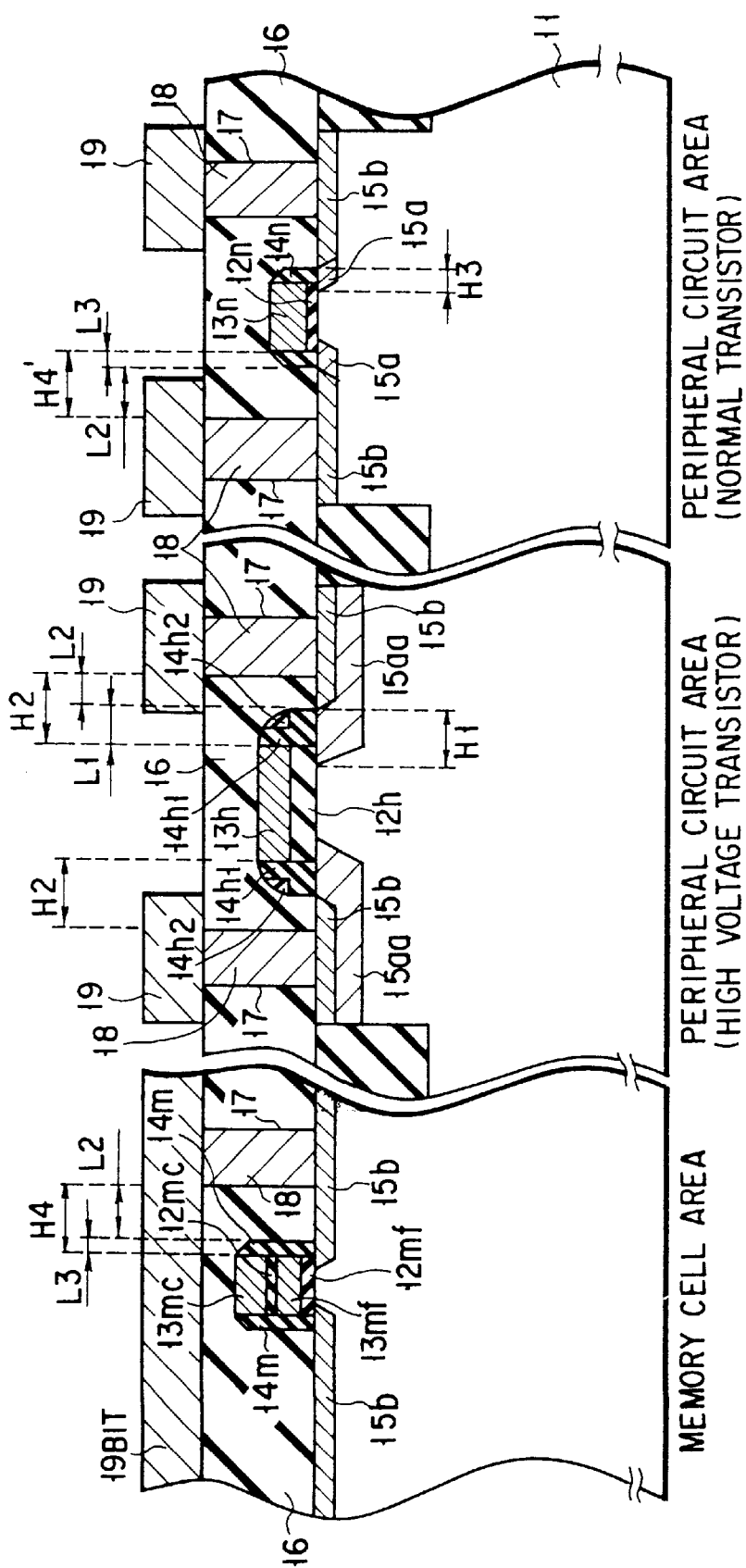
F I G. 26

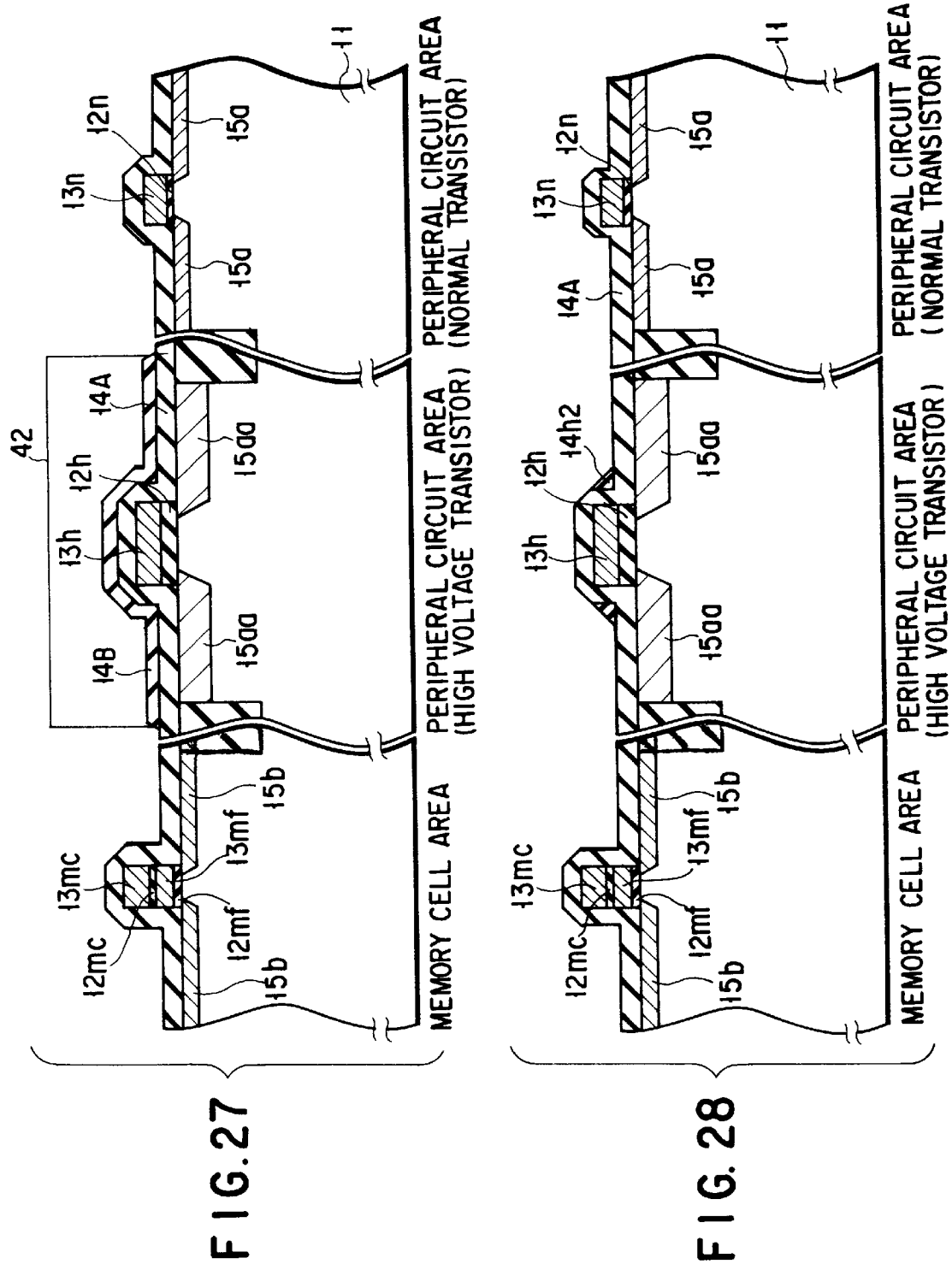

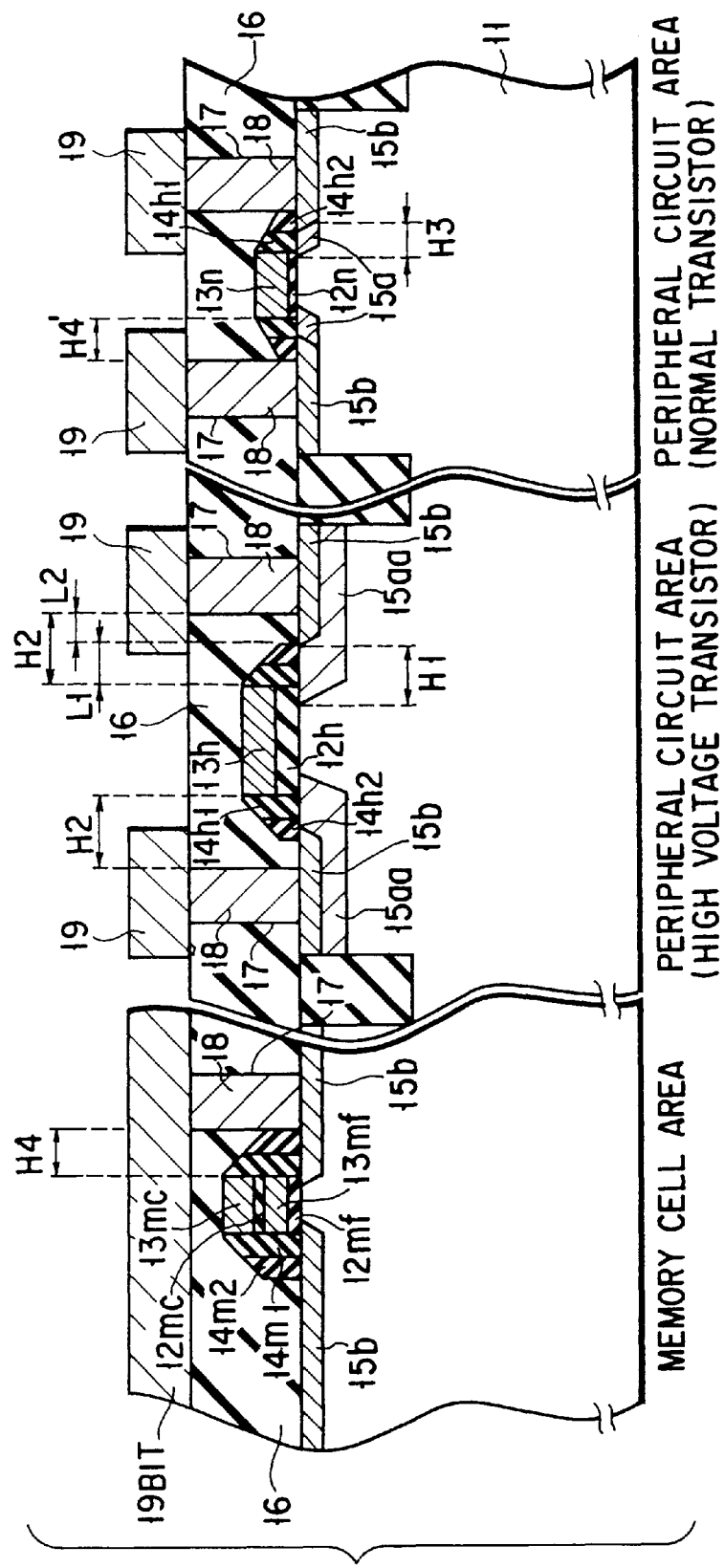
F I G. 34

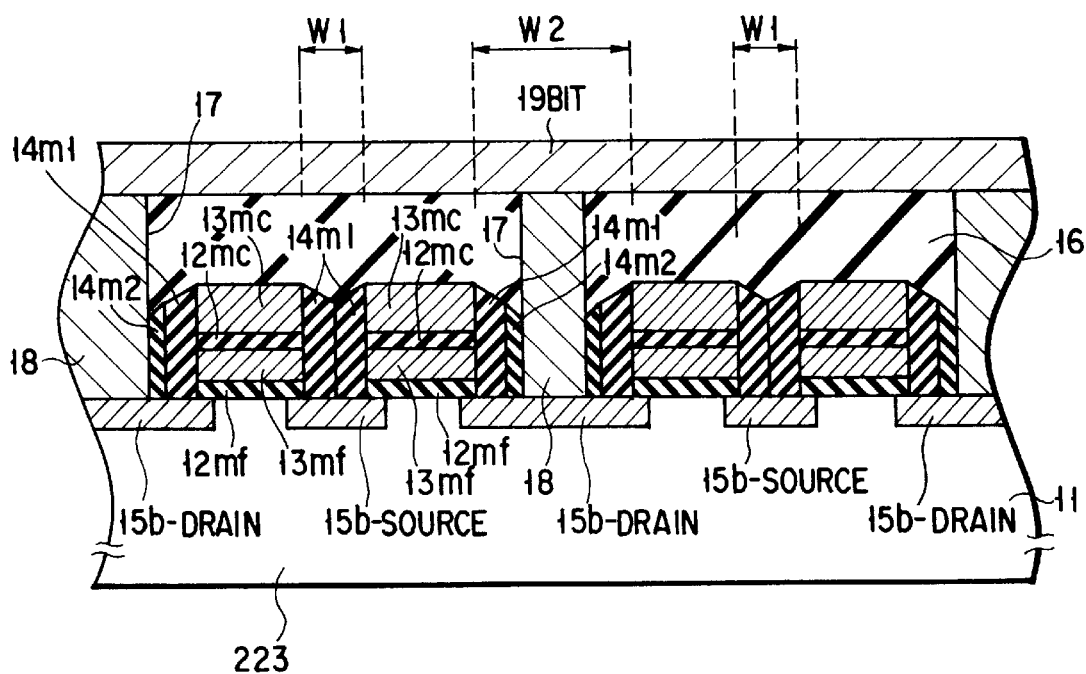
F I G. 35

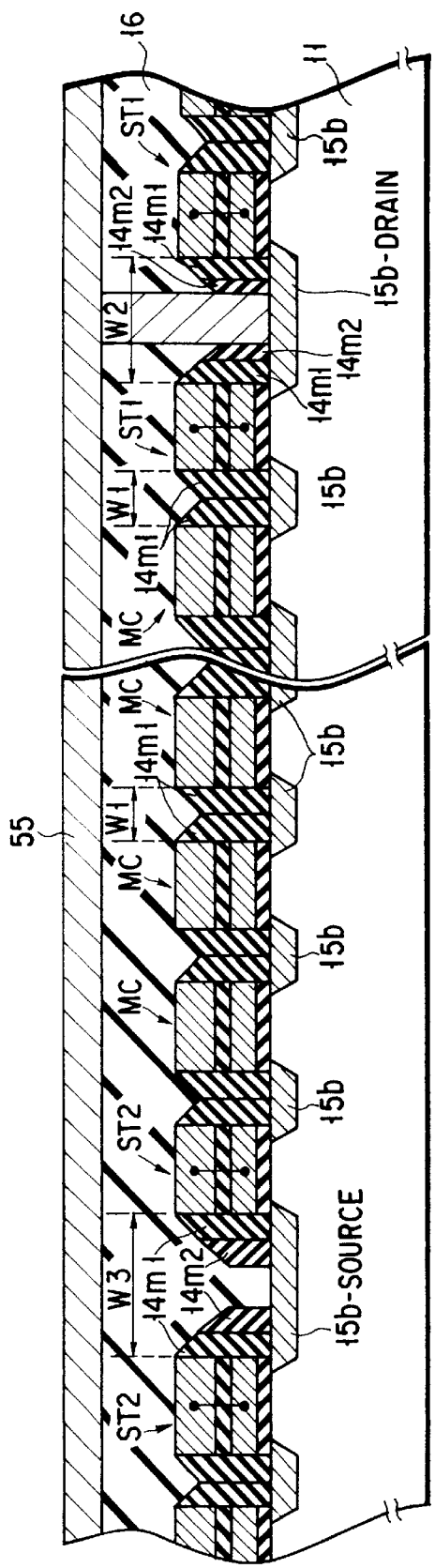
F I G. 36

SEMICONDUCTOR DEVICE HAVING MISFETS

BACKGROUND OF THE INVENTION

The present invention relates to a semiconductor device that has MISFETs, each having a gate electrode and an insulating film called "side wall" on the sides of the gate electrode. More particularly, the invention relates to an integrated circuit that operates with at least two operating voltages, such as a flash EEPROM which operates with an input voltage generated outside the chip externally applied and a high voltage generated inside the chip.

FIG. 1 shows a conventional MISFET.

A gate insulating film 12 is formed on the semiconductor substrate 11. A gate insulating film 13 is formed on the gate insulating film 12. An insulating film 14 called "side wall" is provided on the sides of the gate insulating film 12. Diffusion layers 15a, which have a low impurity concentration and known as "LDDs (Lightly Doped Drains)," are formed in those parts of the substrate 11 which lie beneath the side wall 14.

Beside the diffusion layers 15a, diffusion layers 15b are formed which have a higher impurity concentration than the diffusion layers 15a. A pre-metal dielectric 16 is formed on the substrate 11, covering all other parts of the MISFET. The pre-metal dielectric 16 has a contact hole 17, which reaches one of the diffusion layers 15b. The contact hole 17 is filled with a contact plug 18 made of, for example, tungsten (W). A metal wire 19 is provided on the contact plug 18.

For any LSI having MISFETs described above, the margin between the gate electrode 13 and contact hole 17 of each MISFET is one of the obstacles to the desired increase of integration density. Self-alignment contact (SAC) technique has been proposed as means for reducing the margin between the gate electrode 13 and the contact hole 17, thereby to enhance the integration density of the LSI.

FIG. 2 illustrates a conventional MISFET to which the self-alignment contact technique has been applied.

As shown in FIG. 2, a gate insulating film 12 is provided on the semiconductor substrate 11. A gate electrode 13 is formed on the gate insulating film 12. On the gate electrode 13, a cap insulating film 20 is provided which works as a mask in the process (etching) of making a contact hole 17. An insulating film 14 called "side wall" is provided on the sides of the cap insulating film 20. The side wall 14 also functions as a mask in the process (etching) of making the contact hole 17.

Diffusion layers 15a, which have a low impurity concentration and known as "LDDs," are formed in those parts of the substrate 11 which lie beneath the side wall 14. Beside the diffusion layers 15a, diffusion layers 15b are formed which have a higher impurity concentration than the diffusion layers 15a. A premetal dielectric 16 is formed on the substrate 11, covering all other parts of the MISFET. The pre-metal dielectric 16 has the contact hole 17, which reaches one of the diffusion layers 15b. The contact hole 17 is filled with a contact plug 18 made of, for example, tungsten (W). A metal wire 19 is provided on the contact plug 18.

The MISFET shown in FIG. 2 is characterized in the following respects.

First, the side wall 14 and the cap insulating film 20 function as a mask in the process of making the contact hole 17. That is, the side wall 14, pre-metal dielectric 16 and cap insulating film 20 are made of such materials that the selectivity R2/R1, or the ratio of the etching rate R2 of the pre-metal dielectric 16 to the etching rate R1 of the side wall 14 and cap insulating film 20, is as high as possible. If the pre-metal dielectric 16 is made of, for example, silicon oxide film (e.g., BPSG film or the like), the side wall 14 and cap insulating film 20 will be made of silicon nitride film.

Second, the gate electrode 13 is always insulated from the contact plug 18 made in the contact hole 17. This is because the side wall 14 and cap insulating film 20 function as an etching mask even if the gate electrode 13 happens to overlap the contact hole 17. Thus, the margin between the gate electrode 13 and the contact hole 17 much decreases, serving to enhance the integration density of the LSI.

To enhance the integration density of an LSI having MISFETs to which the self-alignment contact technique (FIG. 2) has been applied, it is required that the side wall 14 have a minimum thickness necessary to maintain the gate electrode 13 and the contact plug 18 insulated from each other. If the side wall 14 has such a minimum thickness, the contact plug 18 can be located sufficiently close to the gate electrode 13 (or can overlap the gate electrode 13) as shown in FIG. 3. Further, contact plug 18 can have an adequate contact area (proportional to distance Sa) with one of the diffusion layers 15b as depicted in FIG. 3.

As shown in FIG. 4, however, the MISFETs may differ in the thickness of the side wall 14 in the course of processing the wafer. The side walls 14 of some MISFETs may be thicker than is desired. If the contact plug 18 is located sufficiently close to the gate electrode 13, the contact area (proportional to distance Sa) at which the contact plug 18 contacts the diffusion layers 15b will become too small. This would increase the contact resistance at the interface between the contact plug 18 and one of the diffusion layers 15b.

FIG. 5 shows a semiconductor device that has two MISFETs sharing a diffusion layer 15bb. The shorter the distance between the gate electrodes 13 of the MISFETS, the smaller the contact area (proportional to distance Sc) between the diffusion layer 15bb and the contact plug 18. The side walls 14 of the two MISFETS, which cover the gate electrodes 13 thereof, may therefore contact each other as shown in FIG. 6. If this occurs, the contact hole 17 cannot reach the surface of the semiconductor substrate 11.

The side wall formed on the side of the gate electrode 13 of each MISFET serves not only to achieve a self-alignment contact, but also to form diffusion layers 15a and 15b of LD structure. The diffusion layers 15a and 15b of LDD structure perform various functions, such as increasing of the breakdown voltage of the p-n junction of the MISFET, mitigating of the generation of hot carriers, and inhibiting of short-channel effect.

Integrated circuits that operate with two or more operating voltages have MISFETs operating at a low voltage and MISFETs operating at a high voltage. In each MISFET operating at the low voltage, the side wall provided on the sides of the gate electrode is made as thin as possible, thereby forming short LDDS. Further, the contact hole reaching the source/drain diffusion layer is located as close as possible to the gate electrode, thereby to enhance the integration density of the LSI.

In each MISFET operating at the high voltage, the side wall provided on the sides of the gate electrode is made as thick as possible, thereby forming long LDDS. Having long LDDS, the MISFET can operate normally even if a high voltage is applied to it.

In order to enhance the integration density of the LSI and also to make the MISFETs operate normally, it is necessary to form MISFETs of at least two types, different in terms of the LDD length, in a single chip. To this end, however, it has hitherto been necessary to form two or more types of side walls, each type for the MISFETs having one LDD length. As a consequence, photo engraving process (PEP) must be repeated as many times as the types of MISFETs required, in the course of processing the wafer.

In other words, an increased number of steps must be carried out to process the wafer, inevitably increasing the cost of manufacturing the LSI. In view of this, it has been impossible, in practice, to form MISFETs of two types, different in terms of LDD length, in a single chip.

FIG. 7 shows a NOR-type flash EEPROM comprising MISFETS. The memory cells arranged in the memory cell area will be described first.

Each memory cells has a stacked gate structure. A gate insulating film 12mf is provided on the semiconductor substrate 11. A floating gate electrode 13mf is provided on the gate insulating film 12mf. An insulating film 12mc is formed on the floating gate electrode 13mf. A control gate 13mc is provided on the insulating film 12mc. An insulating film 14 called "side wall" is provided on the sides of the floating gate electrode 13mf and control gate 13mc. Diffusion layers 15b, which are a source and a drain, are formed in the surface of the semiconductor substrate 11.

A pre-metal dielectric 16 is formed on the semiconductor substrate 11, completely covering the memory cells of the stacked gate structure. The pre-metal dielectric 16 has contact holes 17, each reaching one of the diffusion layers (drain) 15b of each memory cell. Contact plugs 18 made of, for example, tungsten (W), are formed in the contact holes 17. Metal wires 19 are provided on the contact plugs 18.

The NOR-type flash EEPROM has a peripheral circuit area. In the peripheral circuit area, high-voltage transistors are provided. The high-voltage transistors operate at a voltage higher than the power-supply voltage VCC (3.3V, 5V or the like), which ranges, for example, from 6V to 20V.

Gate insulating films 12h are provided on the semiconductor substrate 11. Gate electrodes 13h are provided on the gate insulating films 12h. Each gate insulating film 12h is, for example, about 10 nm thick, or thick enough not to undergo dielectric breakdown when applied with the high voltage. An insulating film 14 called "side wall" is provided on the sides of each gate electrode 13h.

Diffusion layers 15aa having low impurity concentration, called "LDDs (Lightly Doped Drains)," are formed in the surface of the semiconductor substrate 11. Further, diffusion layers 15b (sources and drains) are formed in the diffusion layers 15aa, respectively. The diffusion layers 15b have a higher impurity concentration than the diffusion layers 15aa.

The diffusion layers 15aa are deep so that the breakdown voltage at the p-n junction of each high-voltage transistor may be higher than the operating voltage of the high-voltage transistor. Only diffusion layers 15aa are formed in those parts of the substrate 11, which lie right below each side wall 14. The diffusion layers 15aa have a length H1 that is proportional to the thickness of the side wall 14. The side wall 14 is relatively thick (e.g., about 0.2 $\mu$m), so that the breakdown voltage at the p-n junction of each high-voltage transistor may be higher than the operating voltage of the high-voltage transistor.

The thickness of the diffusion layers 15aa and the thickness of the side walls 14 influences the width of the depletion layer that develops in the p-n junction area of each high-voltage transistor. The thicker the diffusion layers 15aa and side walls 14, the broader the depletion layer and, hence, the higher the breakdown voltage of the high-voltage transistor.

A pre-metal dielectric 16 is formed on the semiconductor substrate 11. The insulator 16 completely covers the MISFETs. The pre-metal dielectric 16 has contact holes 17, each reaching one diffusion layer 15b. Contact plugs 18 made of, for example, tungsten (W), are formed in the contact holes 17. Metal wires 19 are provided on the contact plugs 18.

Low voltage transistors are provided in the peripheral circuit area, too. The low voltage transistors operate at the power-supply voltage VCC (3.3V, 5V or the like), or at a voltage lower than the power-supply voltage VC.

In the peripheral circuit area, gate insulating films 12n are provided on the semiconductor substrate 11. Gate electrodes 13n are provided on the gate insulating films 12h. An insulating film 14 called "side wall" is provided on the sides of each gate electrode 13n. Diffusion layers 15a having low impurity concentration, called "LDDs (Lightly Doped Drains)," are formed in the surface of the semiconductor substrate 11, two located right below one side wall 14.

Adjacent to the respective diffusion layers 15a, diffusion layers 15b (sources and drains) are provided. The diffusion layers 15b have an impurity concentration higher than the diffusion layers 15a. A pre-metal dielectric 16 is formed on the semiconductor substrate 11, also in the peripheral circuit area. The insulator 16 completely covers the MISFETS. The pre-metal dielectric 16 has contact holes 17, each reaching one of the diffusion layers 15b of each low voltage transistor.

In the manufacture of the NOR-type flash EEPROM shown in FIG. 7, the side walls 14 provided in the MISFETs are formed at the same time in the memory cell area and the peripheral circuit area. Hence, the side walls 14 of the memory cells, those of the high-voltage transistors and those of the low voltage transistors have the same thickness.

The side walls 14 are made of silicon oxide film, silicon nitride film or the like, whereas the pre-metal dielectric 16 is made of silicon oxide film. In the case where the side walls 14 are made of silicon oxide film, there may occur errors in the alignment of the gate electrodes with respect to the contact holes.

If alignment errors occur, there will arise the risk that gate electrodes are short-circuited with the contact plugs made in the contact holes.

The side walls 14 may be made of silicon nitride film. In this case, the area (contact area) at which one diffusion layer is exposed at the bottom of one contact hole 17 will decrease if the contact hole 17 overlaps the side wall 14. This increases the contact resistance at the interface between the contact plug 18 and one of the diffusion layers 15b. To prevent the contact holes 17 from overlapping the side walls 14, respectively, the margin (width) H2 between each gate electrode and the adjacent contact hole is set at a sufficient value. More specifically, the margin H2 is the sum of the thickness L1 of the side walls 14 and the margin L2 between the side wall 14 and the contact hole. The margin L2 is determined from the accuracy of aligning a mask in the photo engraving process (PEP) and the dimensional precision of the contact hole 17.

For example, the margin (width) H2 between the gate electrode and the adjacent contact hole will be 0.4 $\mu$m if the side wall 14 has a thickness L1 of 0.2 $\mu$m and the margin L2 between the gate electrode and the contact hole 17 is 0.2 $\mu$m.

Thus, if the side walls 14 are made of material that is more hardly etched than the pre-metal dielectric 16 (e.g., silicon nitride film), the margin H2 between each side wall 14 and the adjacent contact hole 17 must be sufficiently large. Otherwise, the contact hole 17 would overlap the side wall 14. If the margin H2 is increased, however, the MISFETs (including the memory cells) will become large, which is undesirable in view of the enhancement of the integration density of the LSI and the desired reduction of the chip area.

In the NOR-type flash EEPROM, the memory cells have no LDDs. As far as the memory cells are concerned, the side walls 14 are not necessary. Nonetheless, each memory cell has a side wall to facilitate or simplify the processing of the wafer. As a consequence, every memory cell of the NOR-type flash EEPROM is larger by the thickness L1 of the side wall 14 than those, which have no side walls.

The thickness L1 of each side wall 14 is determined so as to impart sufficiently high breakdown voltage to the p-n junction of each high-voltage transistor. Hence, the side wall 14 of each low voltage transistor is excessively thick, and the diffusion layers 15a (LDDS) of each low voltage transistor have an excessive length L3. The low voltage transistor is inevitably large, having an on-resistance. The low voltage transistors will have but inadequate driving capacity.

BRIEF SUMMARY OF THE INVENTION

The object of the present invention is to provide a semiconductor device, in which MISFETS (normal transistor or low voltage transistor) operating at a low voltage have short LDDs and self-alignment structure, thus serving to increase the integration density of an LSI without causing an increase in the contact resistance, and MISFETs (high-voltage transistors) operating at a high voltage have LDDs and a sufficient margin between the gate electrode and the contact hole and a p-n junction with a sufficiently high breakdown voltage.

A semiconductor device according to the present invention comprises: a source/drain diffusion layer provided in a semiconductor substrate; an LDD diffusion layer provided in the semiconductor substrate and located adjacent to the source/drain diffusion layer; a gate electrode arranged above the semiconductor substrate; a pre-metal dielectric covering the gate electrode; a first side-wall film provided on sides of the gate electrode; and a second side-wall film provided on sides of the first side-wall film and different in material from the first side-wall film.

Another semiconductor device according to the invention comprises: a source/drain diffusion layer provided in a semiconductor substrate; a floating gate electrode arranged above the semiconductor substrate; a control gate electrode arranged above the floating gate electrode; a pre-metal dielectric covering the floating gate electrode and control gate electrode; a first side-wall film provided on sides of the floating gate electrode and control gate electrodes; and a second side-wall film provided on sides of the first side-wall film and different in material from the first side-wall film.

Still another semiconductor device according to the invention comprises: a first MISFET operating at a first operating voltage; a second MISFET operating at a second operating voltage higher than the first operating voltage; and a pre-metal dielectric covering the first and second MISFETS. The first MISFET comprises a first source/drain diffusion layer provided in a semiconductor substrate; a first LDD diffusion layer provided in the semiconductor substrate and located adjacent to the first source/drain diffusion layer; a first gate electrode arranged above the semiconductor substrate; a first side-wall film provided on sides of the first gate electrode; and a second side-wall film provided on sides of the first side-wall film and different in material from the first side-wall film. The second MISFET comprises a second source/drain diffusion layer provided in the semiconductor substrate; a second LDD diffusion layer provided in the semiconductor substrate and located adjacent to the second source/drain diffusion layer; a second gate electrode arranged above the semiconductor substrate; a third side-wall film provided on sides of the second gate electrode; and a fourth side-wall film provided on sides of the third side-wall film and different in material from the third side-wall film.

A semiconductor device according to the present invention comprises: a first MISFET operating at a first operating voltage; a second MISFET operating at a second operating voltage higher than the first operating voltage; and a pre-metal dielectric covering the first and second MISFETS. The first MISFET comprises a first source/drain diffusion layer provided in a semiconductor substrate; a first LDD diffusion layer provided in the semiconductor substrate and located adjacent to the first source/drain diffusion layer; a first gate electrode arranged above the semiconductor substrate; and a first side-wall film provided on sides of the first gate electrode. The second MISFET comprises a second source/drain diffusion layer provided in the semiconductor substrate; a second LDD diffusion layer provided in the semiconductor substrate and located adjacent to the second source/drain diffusion layer; a second gate electrode arranged above the semiconductor substrate; a second side-wall film provided adjacent to the second gate electrode; and a third side-wall film provided adjacent to the second side-wall film and different in material from the second side-wall film.

Another semiconductor device according to this invention comprises: a plurality of memory cells connected in series; and a pre-metal dielectric covering the plurality of memory cells, each comprising a source diffusion layer provided in a semiconductor substrate, a drain diffusion layer provided in the semiconductor substrate, a floating gate electrode provided above a channel area between the source and drain diffusion layers, and a control gate electrode provided above the floating gate electrode. The first of a plurality of spaces among the plurality of memory cells is broader than the second space provided above the source diffusion layer, and the second of the spaces is filled with a first side-wall film contacting sides of the floating gate electrode and control gate electrode.

A still another semiconductor device according to the invention comprises: a cell unit comprising a plurality of memory cells connected in series; a first select transistor connected to one end of the cell unit and having a source diffusion layer; a second select transistor connected to another end of the cell unit and having a drain diffusion layer; and a pre-metal dielectric covering the memory cells and the first and second select transistors. Each of the plurality of memory cells comprises diffusion layers provided in a semiconductor substrate, a floating gate electrode provided above a channel area between the diffusion layers, and a control gate electrode provided above the floating gate electrode. Each of spaces among the plurality of memory cells is filled with a first side-wall film contacting sides of the floating gate electrode and control gate electrode.

A method of manufacturing a semiconductor device, according to the present invention, comprises the steps of: forming, above a semiconductor substrate, a first gate electrode of a first MISFET operating at a first operating voltage and a second gate electrode of a second MISFET operating at a second operating voltage higher than the first operating voltage; performing ion implantation, thereby forming a first LDD of the first MISFET and a second LDD of the second MISFET in the semiconductor substrate; forming a first film covering the first and second gate electrodes, above the semiconductor substrate; performing anisotropic etching on the first film, thereby forming a first side-all film on sides of the first and second gate electrodes; performing ion implantation, thereby forming a first source/drain diffusion layer of the first MISFET in the semiconductor substrate; forming a second film covering the first and second gate electrode, above the semiconductor substrate; performing anisotropic etching on the second film, thereby forming a second side-all film on sides of the first and second gate electrodes; and performing ion implantation, thereby forming a second source/drain diffusion layer of the second MISFET in the semiconductor substrate.

Another method of manufacturing a semiconductor device, according to the invention, comprises the steps of: forming, above a semiconductor substrate, a first gate electrode of a first MISFET operating at a first operating voltage and a second gate electrode of a second MISFET operating at a second operating voltage higher than the first operating voltage; performing ion implantation, thereby forming a first LDD of the first MISFET and a second LDD of the second MISFET in the semiconductor substrate; forming a first film covering the first and second gate electrodes, above the semiconductor substrate; forming a second film on the first film, the second film being different in material from the first film; performing anisotropic etching on the second film, thereby forming a first side-all film at a stepped part near the first gate electrode and a stepped part near the second gate electrode; and performing ion implantation, thereby forming a first source/drain diffusion layer of the first MISFET and a second source/drain diffusion layer of the second MISFET, in the semiconductor substrate.

Still another method of manufacturing a semiconductor device, according to the invention, comprises the steps of: forming, above a semiconductor substrate, a first gate electrode of a first MISFET operating at a first operating voltage and a second gate electrode of a second MISFET operating at a second operating voltage higher than the first operating voltage; performing ion implantation, thereby forming a first LDD of the first MISFET and a second LDD of the second MISFET in the semiconductor substrate; forming a first film covering the first and second gate electrodes, above the semiconductor substrate; forming a second film on the first film, the second film being different in material from the first film; performing partial etching on the second film, thereby removing a part of the second film which lies above the first MISFET and leaving the second film above the second MISFET; performing anisotropic etching on the second film, thereby forming a first side-wall film at a stepped part near the second gate electrode; performing anisotropic etching on the first film, thereby forming a second side-all film on sides of the first and second gate electrodes; and performing ion implantation, thereby forming a first source/drain diffusion layer of the first MISFET and a second source/drain diffusion layer of the second MISFET in the semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a sectional view illustrating another type of a conventional MISFET;

FIG. 5 is a sectional view showing a semiconductor device having conventional MISFETs;

FIG. 6 is a sectional view explaining the disadvantage of the conventional MISFETs;

FIGS. 11 to 20 are sectional views, explaining the method of manufacturing the NOR-type flash EEPROM shown in FIGS. 9 and 10;

FIGS. 22 to 28 are sectional views, explaining the method of manufacturing the NOR-type flash EEPROM shown in FIG. 21;

FIGS. 30 to 34 are sectional views, explaining the method of manufacturing the NOR-type flash EEPROM shown in FIG. 29;

FIG. 35 is a sectional view depicting the memory cells incorporated in a NOR-type flash EEPROM; and FIG. 36 is a sectional view showing the memory cells incorporated in a NAND-type flash EEPROM.

DETAILED DESCRIPTION OF THE INVENTION

Semiconductor devices, each having MISFETs according to the present invention, will be described in detail, with reference to the accompanying drawings.

Figure 8:
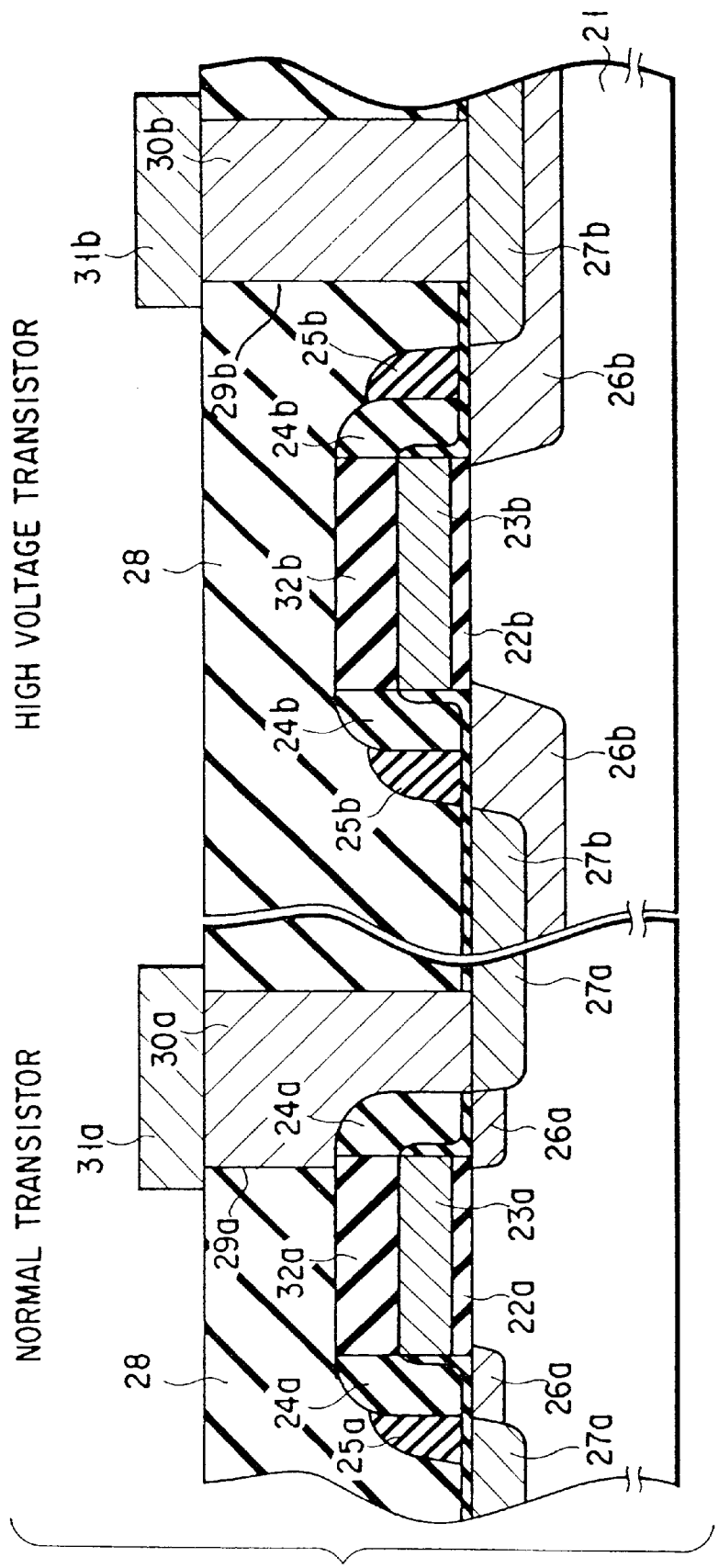
FIG. 8 is a semiconductor device that has MISFETS according to the present invention.

FIG. 8 shows a semiconductor device having MISFETs according to the invention, to which self-alignment contact technique has been applied.

The semiconductor device has low voltage MISFETs (normal transistors) that operate at a low voltage (e.g., power-supply voltage VCC) and high-voltage MISFETs (high-voltage transistors) that operate at a high voltage (i.e., a voltage higher than the power-supply voltage VCC).

One of the low voltage transistors, which are identical, will be described first.

A gate insulating film 22a is formed on the semiconductor substrate 21. A gate electrode 23a is formed on the gate insulating film 22a. A cap insulating film 32a, which serves as a mask in the process (etching) of forming a contact hole 29a, is formed on the gate electrode 23a. A side wall is formed on the sides of the gate electrode 23a and cap insulating film 32a. A pre-metal dielectric 28 is formed on the semiconductor substrate 21, completely covering the MISFETS.

The side wall consists of two side-wall films 24a and 25a that are made of different materials.

The side-wall film 24a contacts the sides of the gate electrode 23a and cap insulating film 32a. The side-wall film 34a, cap insulating film 32a and interlayer electrode 28 are made of such materials that the selectivity R2/R1, or the ratio of the etching rate R2 of the pre-metal dielectric 28 to the etching rate R1 of the side-wall film 24a and cap insulating film 32a, is as high as possible. If the pre-metal dielectric 28 is made of, for example, silicon oxide film (e.g., BPSG film or the like), the side-wall film 24a and cap insulating film 32a will be made of silicon nitride film. Thus, the side-wall film 24a and the cap insulating film 32a are scarcely etched when the contact hole 29a is made in the pre-metal dielectric 28.

The side-wall film 25a contacts the side-wall film 24a and has substantially the same etching rate as the pre-metal dielectric 28. That is, the film 25a is made of material that is etched along with the pre-metal dielectric 28 at the time of forming the contact hole 29a (in the course of etching). For example, the film 25a is made of the same material (silicon nitride film) as the pre-metal dielectric 28.

The side-wall film 25a may be made of either electrically conductive material or electrically insulating material. The side-wall film 24a is made of electrically insulating material in order to insulate the gate electrode 23a completely from the contact plug 30a formed in the contact hole 29a. The side-wall film 25a does not exist in the contact hole 29a. By contrast, at least one part of the side-wall film 24a exists in the contact hole 29. Hence, the side-wall film 24a completely insulates the electrode 23a from the contact plug 30a.

Diffusion layers 26a, which have a low impurity concentration and known as "LDDs (Lightly Doped Drains)," are formed in those parts of the substrate 21 which lie beneath the side-wall film 24a. The diffusion layers 26a have a length, i.e., LDD length, which is substantially equal to the thickness of the side-wall film 24a. Beside the diffusion layers 26a, diffusion layers 27a (source and drain) is formed which has a higher impurity concentration than the diffusion layers 26a.

In the pre-metal dielectric 28, the contact hole 29a is made, reaching one of the diffusion layers 27a. The contact hole 29a may or may not overlap the side-wall film 24a. Further, the contact hole 29a may or may not overlap the gate electrode 23a. The side-wall film 25a does not exist in the contact hole 29a.

It is in the contact hole 29a that the contact plug 30a is formed. The plug 30a is made of, for example, tungsten (W). A metal wire 31a is provided on the contact plug 30a.

One of the high-voltage transistors, which are identical, will now be described.

A gate insulating film 22b is formed on the semiconductor substrate 21. A gate electrode 23b is formed on the gate insulating film 22b. A cap insulating film 32b is formed on the gate electrode 23b. A side wall is formed on the sides of the gate electrode 23b and cap insulating film 32b. A pre-metal dielectric 28 is formed on the semiconductor substrate 21, completely covering the MISFETs.

The side-wall film 24b contacts the sides of the gate electrode 23b and cap insulating film 32b. The side-wall film 24b, cap insulating film 32b and interlayer electrode 28 are made of such materials that the selectivity R2/R1, or the ratio of the etching rate R2 of the pre-metal dielectric 28 to the etching rate R1 of the side-wall film 24b and cap insulating film 32b, is as high as possible. If the pre-metal dielectric 28 is made of, for example, silicon oxide film (e.g., BPSG film or the like), the side-wall film 24b and cap insulating film 32b will be made of silicon nitride film.

The side-wall film 25b contacts the side-wall film 24b and has substantially the same etching rate as the pre-metal dielectric 28. The side-wall film 25b is made of, for example, the same material (silicon nitride film or the like) as the pre-metal dielectric 28.

In the high-voltage transistor, the margin between the gate electrode 23b and the contact hole 29b is determined such that the contact hole 29b overlaps neither the gate electrode 23b nor the side-wall films 24b and 25b. Namely, self-alignment contact technique is not applied to the high-voltage transistor.

Diffusion layers 26b, which have a low impurity concentration and known as "LDDs (Lightly Doped Drains)," are formed in those parts of the substrate 21 which lie beneath the side-wall films 24b and 25b. The diffusion layers 26b have a length, i.e., LDD length, which is longer than the LDD length of the low voltage transistor by the thickness of the side-wall film 25b. Beside the diffusion layers 26b, diffusion layers 27b (source and drain) are formed which have a higher impurity concentration than the diffusion layers 26b.

In the pre-metal dielectric 28, the contact hole 29b is made, reaching one of the diffusion layers 27b. The contact hole 29b may not overlap the side-wall film 24b. Further, the contact hole 29b may not overlap the gate electrode 23b.

It is in the contact hole 29b that the contact plug 30b is formed. The plug 30b is made of, for example, tungsten (W). A metal wire 31b is provided on the contact plug 30b.

In the semiconductor device shown in FIG. 8, a side wall composed of two side-wall films made of different materials is formed on the sides of the gate electrode of each MISFET. More specifically, the side wall consists of the side-wall film 24a or 24b and the side-wall film 25a or 25b. The first side-wall film 24a or 24b has an etching rate lower than that of the pre-metal dielectric 26. By contrast, the second side-wall film 25a or 25b has an etching rate that is substantially equal to that of the pre-metal dielectric 28.

In each low voltage transistor that operates at a low voltage, only the side-wall film 24a exists between the contact plug 30a and that part of the gate electrode 23a, which opposes the plug 30a, formed in the contact hole 29a. The other side-wall film 25a does not exist there. Needless to say, both side-wall films 24a and 25a exist around the gate electrode 23a, except said part opposing the plug 30a formed in the contact hole 29a. Further, the diffusion layers 26a, which function as LDDs, are formed right below the side-wall film 24a only. Thus, each low voltage transistor helps to enhance the integration density of the semiconductor device (LSI), because it has a self-alignment contact structure and a short LDD length.

In each high-voltage transistor, which operates at a high voltage, the contact hole 29b overlaps neither the side-wall film 24b nor the side-wall film 25b. Further, the diffusion layers 26b, which function as LDDS, are formed right below the side-wall films 24b and 25b. The breakdown voltage of the p-n junction can, therefore, be increased in the high-voltage transistor.

As indicated above, the semiconductor device of the invention comprises low voltage transistors and high-voltage transistors, all formed in one chip. The integration density of the low voltage transistors can be increased due to the self-alignment contact technique applied to the device. In addition, the breakdown voltage of the p-n junction of each high-voltage transistor can be raised, thanks to the long LDD length of the high-voltage transistor.

Figure 9:
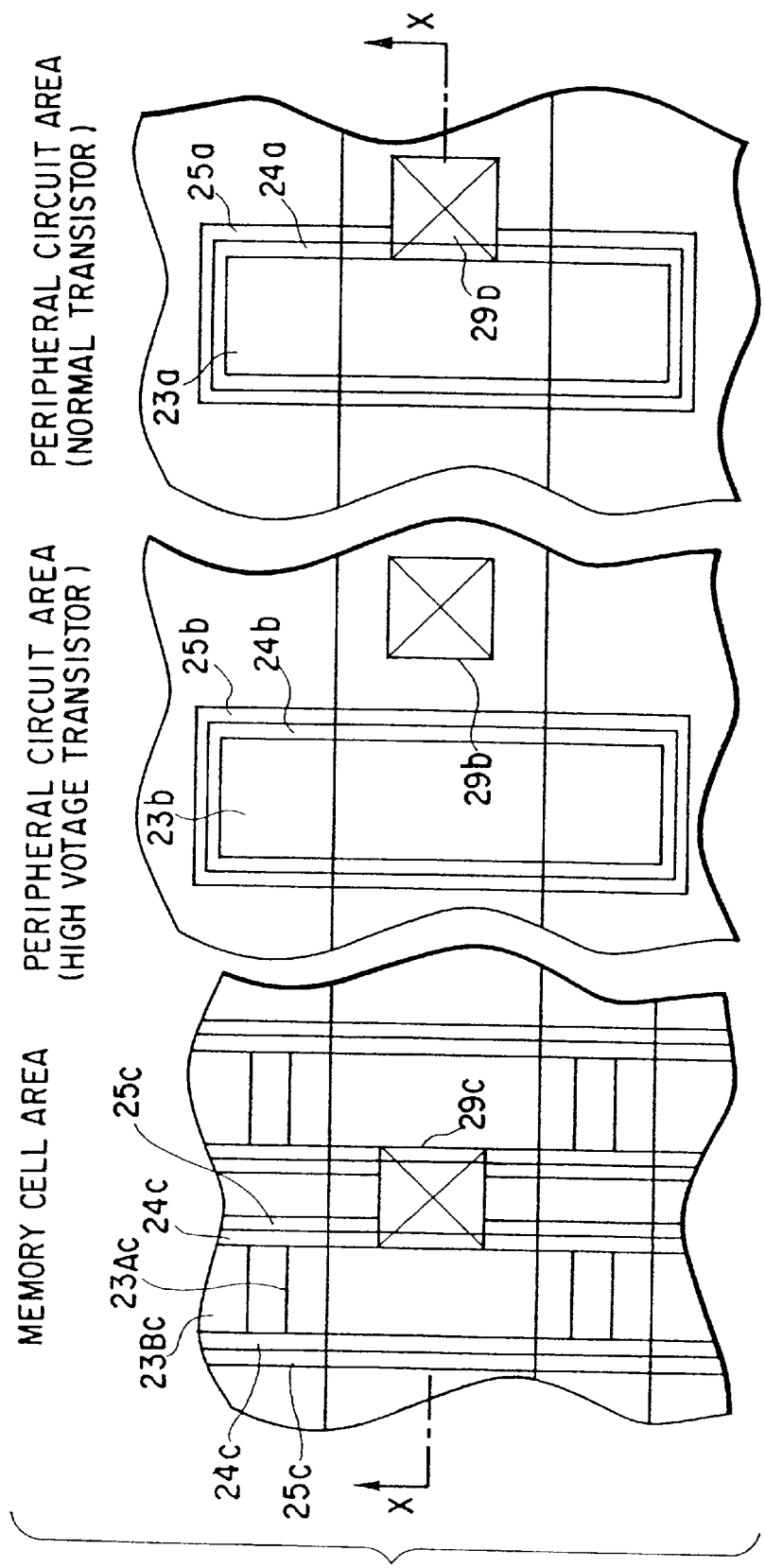
FIG. 9 is a plan view depicting MISFETs according to the present invention, which are incorporated in a NOR-type flash EEPROM.
Figure 10:
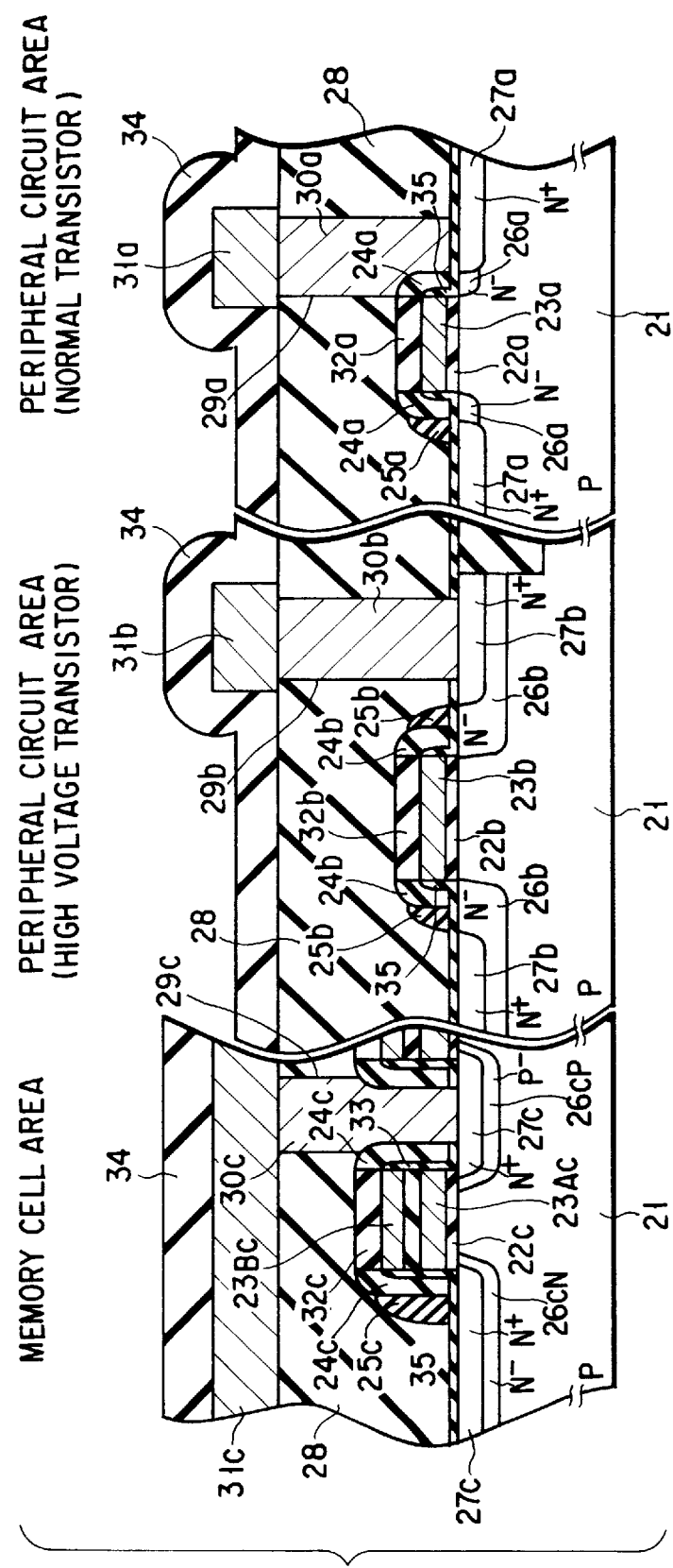
FIG. 10 is a sectional view taken along line X—X in FIG. 9.

FIG. 9 shows a semiconductor device that has MISFETs according to the invention, to which self-alignment contact technique has been applied. FIG. 10 is a sectional view taken along line X—X in FIG. 9.

This semiconductor device is a NOR-type flash EEPROM that has a memory cell area and a peripheral circuit area. Memory cells of stacked gate structure are arranged in the memory cell area. In the peripheral circuit area there are arranged low voltage MISFETs (normal transistors) and high-voltage MISFETs (high-voltage transistors). The low voltage transistors operate at a low voltage (e.g., power-supply voltage VCC). The high-voltage transistors operate at a high voltage (i.e., a voltage higher than the power-supply voltage VCC).

One of the low voltage transistors arranged in the peripheral circuit area, which are identical, will be described first.

A gate insulating film 22a is formed on the P-type semiconductor substrate 21 (or a well region). A gate electrode 23a is formed on the gate insulating film 22a. A cap insulating film 32a, which serves as a mask in the process (etching) of forming a contact hole 29a, is formed on the gate electrode 23a. A side wall is formed on the sides of the gate electrode 23a and cap insulating film 32a. A pre-metal dielectric 28 is formed on the semiconductor substrate 21, completely covering the MISFETs.

The side wall consists of two side-wall films 24a and 25a that are made of different materials.

The side-wall film 24a contacts the sides of the gate electrode 23a and cap insulating film 32a. The side-wall film 34a, cap insulating film 32a and interlayer electrode 28 are made of such materials that the selectivity R2/R1, or the ratio of the etching rate R2 of the pre-metal dielectric 28 to the etching rate R1 of the side-wall film 24a and cap insulating film 32a, is as high as possible. If the pre-metal dielectric 28 is made of, for example, silicon oxide film (e.g., BPSG film or the like), the side-wall film 24a and cap insulating film 32a will be made of silicon nitride film. Hence, the side-wall film 24a and the cap insulating film 32a are scarcely etched when the contact hole 29a is made in the pre-metal dielectric 28.

The side-wall film 25a contacts the side-wall film 24a and has substantially the same etching rate as the pre-metal dielectric 28. That is, the film 25a is made of material that is etched together with the pre-metal dielectric 28 at the time of forming the contact hole 29a (in the course of etching). For example, the film 25a is made of the same material (silicon nitride film) as the pre-metal dielectric 28.

The side-wall film 25a may be made of either electrically conductive material or electrically insulating material. The side-wall film 24a is made of electrically insulating material in order to insulate the gate electrode 23a completely from the contact plug 30a formed in the contact hole 29a. The side-wall film 25a does not exist in the contact hole 29a. By contrast, at least one part of the side-wall film 24a exists in the contact hole 29a. Hence, the side-wall film 24a completely insulates the electrode 23a from the contact plug 30a.

N⁻-type diffusion layers 26a, which has a low impurity concentration and known as "LDDs (Lightly Doped Drains)," are formed in those parts of the P-type substrate 21 which lie beneath the side-wall film 24a. The diffusion layers 26a have a length, i.e., LDD length, which is substantially equal to the thickness of the side-wall film 24a. Beside the N⁻-type diffusion layers 26a, N⁺-type diffusion layers 27a (source and drain) are formed which have a higher impurity concentration than the N⁻-type diffusion layers 26a.

In the N⁺-type pre-metal dielectric 28, the contact hole 29a is made, reaching one of the diffusion layers 27a. The contact hole 29a may or may not overlap the side-wall film 24a. Further, the contact hole 29a may or may not overlap the gate electrode 23a. The side-wall film 25a does not exist in the contact hole 29a.

It is in the contact hole 29a that the contact plug 30a is formed. The plug 30a is made of, for example, tungsten (W). A metal wire 31a is provided on the contact plug 30a. On the pre-metal dielectric 38a, an interlayer insulator 34 is formed, completely covering the metal wire 31a.

One of the high-voltage transistors arranged in the peripheral circuit area, which are identical will now be described.

A gate insulating film 22b is formed on the P-type semiconductor substrate 21 (or a well region). A gate electrode 23b is formed on the gate insulating film 22b. A cap insulating film 32b is formed on the gate electrode 23b. A side wall is formed on the sides of the gate electrode 23b and cap insulating film 32b. A pre-metal dielectric 28 is formed on the semiconductor substrate 21, completely covering the MISFETs.

The side wall consists of two side-wall films 24b and 25b that are made of different materials.

The side-wall film 24b contacts the sides of the gate electrode 23b and cap insulating film 32b. The side-wall film 34b, cap insulating film 32b and interlayer electrode 28 are made of such materials that the selectivity R2/R1, or the ratio of the etching rate R2 of the pre-metal dielectric 28 to the etching rate R1 of the side-wall film 24b and cap insulating film 32b, is as high as possible. If the pre-metal dielectric 28 is made of, for example, silicon oxide film (e.g., BPSG film or the like), the side-wall film 24b and cap insulating film 32b will be made of silicon nitride film.

The side-wall film 25b contacts the side-wall film 24b and has substantially the same etching rate as the pre-metal dielectric 28. For example, the film 25b is made of the same material (silicon nitride film) as the pre-metal dielectric 28.

In the high-voltage transistor, the margin between the gate electrode 23b and the contact hole 29b is sufficiently large so that the contact hole 29b overlaps neither the gate electrode 23b nor the side-wall films 24b and 25b. That is, self-alignment contact technique is not applied to the high-voltage transistor.

N⁻-type diffusion layers 26b, which have a low impurity concentration and known as "LDDs (Lightly Doped Drain)," are formed in those parts of the substrate 21 which lie beneath the side-wall films 24b and 25b. The diffusion layers 26b have a length, i.e., LDD length, which is longer than the LDD length of the low voltage transistor by the thickness of the side-wall film 25b. Beside the diffusion layers 26b, an N⁺-type diffusion layers 27b (source and drain) are formed which have a higher impurity concentration than the N⁻-type diffusion layers 26b.

In the pre-metal dielectric 28, the contact hole 29b is made, reaching one of the N⁺-type 27b. The contact hole 29b has been formed, not overlapping the side-wall film 24b or the side-wall film 25b.

It is in the contact hole 29b that the contact plug 30b is formed. The plug 30b is made of, for example, tungsten (W).

A metal wire 31b is provided on the contact plug 30b. On the pre-metal dielectric 38b, an interlayer insulator 34 is formed, completely covering the metal wire 31b.

One of the memory cells arranged in the memory cell area, which are identical, will be described below.

A gate insulating film 22c is formed on the P-type semiconductor substrate 21 (or a well region). A floating gate electrode 23Ac is formed on the gate insulating film 22c. An insulating film 33 (e.g., a so-called "ONO film") is formed on the floating gate electrode 23Ac. A control gate electrode 23Bc is provided on the insulating film 33. A cap insulating film 32c, which serves as a mask in the process (etching) of forming a contact hole 29c, is formed on the control gate electrode 23Bc. A side wall is formed on the sides of the floating gate electrode 23Ac, control gate electrode 23B and cap insulating film 32c. A pre-metal dielectric 28 is formed on the semiconductor substrate 21, completely covering the MISFETS.

The side wall consists of two side-wall films 24c and 25c that are made of different materials.

The side-wall film 24c contacts the sides of the floating gate electrode 23Ac, control gate electrode 23Bc and cap insulating film 32c. The side-wall film 34c, cap insulating film 32c and interlayer electrode 28 are made of such materials that the selectivity R2/R1, or the ratio of the etching rate R2 of the pre-metal dielectric 28 to the etching rate R1 of the side-wall film 24c and cap insulating film 32c, is as high as possible. If the pre-metal dielectric 28 is made of, for example, silicon oxide film (e.g., BPSG film or the like), the side-wall film 24c and cap insulating film 32c will be made of silicon nitride film. Hence, the side-wall film 24c and the cap insulating film 32c are scarcely etched when the contact hole 29c is made in the pre-metal dielectric 28.

The side-wall film 25c contacts the side-wall film 24c and has substantially the same etching rate as the pre-metal dielectric 28. That is, the film 25c is made of material that is etched together with the pre-metal dielectric 28 at the time of forming the contact hole 29c. For example, the film 25c is made of the same material (silicon nitride film) as the pre-metal dielectric 28.

The side-wall film 25c may be made of either electrically conductive material or electrically insulating material. On the other hand, the side-wall film 24c is made of electrically insulating material in order to insulate the gate electrodes 23Ac and 23BC completely from the contact plug 30c formed in the contact hole 29c. The side-wall film 25c does not exist in the contact hole 29c. By contrast, at least one part of the side-wall film 24c exists in the contact hole 29a. Hence, the side-wall film 24c completely insulates the gate electrodes 23Ac and 23Bc from the contact plug 30c.

The memory cells are of so-called "source-erasing type." In each memory cell, electrons are moved from the floating gate into the source to erase data. This is why diffusion layers 26cN and 26cP, both having a low impurity concentration, and diffusion layers 27c having a high impurity concentration are formed in those parts of the semiconductor substrate 21 which lie right below the side-wall films 24c and 25c. The drain of each memory cell is composed of the N⁺-type diffusion layer 27c and the P⁻-type diffusion layer 26cP. The source of the memory cell is composed of the N⁺-type diffusion layer 27c and the N⁻-type diffusion-layers 26cN.

In the pre-metal dielectric 28, the contact hole 29c is made, reaching the diffusion layer 27c. The contact hole 29c may or may not overlap the side-wall film 24c. Further, it may or may not overlap the control gate 23Bc and the floating gate 23Ac. The side-wall film 25c does not exist in the contact hole 29c.

It is in the contact hole 29c that the contact plug 30c is formed. The plug 30b is made of, for example, tungsten (W). A metal wire 31c is provided on the contact plug 30c. On the pre-metal dielectric 28, an interlayer insulator 34 is formed, completely covering the metal wire 31c.

In the flash EEPROPM shown in FIGS. 9 and 10, which has MISFETS, the side wall formed on the side of the gate electrodes of each MISFET is composed of two side-wall films made of different materials. To be more specific, the first side-wall film is film 24a, 24b or 24c that has an etching rate lower than that of the pre-metal dielectric 28, and the second side-wall film 25a, 25b or 25c that has an etching rate substantially equal to that of the pre-metal dielectric 28.

In each of the low voltage transistors that operate at a low voltage, only the side-wall film 24a exists between the gate electrode 23a and the contact hole 29a; the side-wall film 25a does not exist there. Needless to say, both side-wall films 24a and 25a exist around the gate electrode 23a, except that part of the gate electrode 23a which opposes the plug 30a formed in the contact hole 29a. Further, the diffusion layers 26a, which function as LDDs, are formed right below the side-wall film 24a only.

Thus, the low voltage transistors have a self-alignment contact structure and no increased contact resistance. The area the low voltage transistors occupy can, therefore, be reduced. In addition, since the low voltage transistors have short LDDs, they serve to enhance the integration density of the flash EEPROM (LSI).

In each of the high-voltage transistors, the contact hole 29b overlaps neither the side-wall film 24b nor the side-wall film 25b. Moreover, the diffusion layers 26b, which function as LDDs, are formed right below the side-wall films 24b and 25b. The diffusion layers 26b have a long LDD length, which imparts a high breakdown voltage (e.g., 10V or more) to the p-n junction of the high-voltage transistor.

In each of the memory cells, only the side-wall film 24c exists between the contact hole 29c on the one hand and the gate electrodes 23Ac and 23Bc on the other. The other side-wall film 25c does not exist there. Needless to say, both side-wall films 24c and 25c exist around the gate electrodes 23Ac 23Bc, except those parts of the electrode 23Ac and 23Bc which oppose the plug 30c formed in the contact hole 29c. Hence, the memory cells have a self-alignment contact structure and no increased contact resistance. The area the memory cells occupy in the flash EEPROM can therefore be reduced.

As described above, in the semiconductor devices according to the invention, which has low voltage transistors (including memory cells) and high-voltage transistors, the low voltage transistors can be arranged in a high integration density due to the self-alignment contact technique applied to them. Furthermore, the p-n junction of each high-voltage transistor can have a sufficiently high breakdown voltage due to the long LDD length of the high-voltage transistor.

In the embodiments described above, N-channel MISFETs are formed in the P-type semiconductor substrate (or well region). Nonetheless, the present invention can, of course, be applied to semiconductor devices that have P-channel MISFETs formed in an N-type semiconductor substrate (or well region).

The method of manufacturing the flash EEPROM depicted in FIGS. 9 and 10 will now be explained.

First, as shown in FIG. 11, the gate electrode 23a of each low voltage transistor (normal transistor) and the gate electrode 23b of each high-voltage transistor are formed in the peripheral circuit area. At the same time, the floating gate 23Ac and control gate 23Bc of each memory cell are formed in the memory cell area, as illustrated in FIG. 10.

The gate electrodes 23a and 23b, floating gate 23Ac and control gate 23Bc are formed by known techniques. The gate electrodes 23a and 23b may be formed by, for example, CVD (Chemical Vapor Deposition), PEP (Photo Engraving Process) and RIE (Reactive Ion Etching) in the peripheral circuit area. The floating gate 23Ac and the control gate 23Bc may be formed by, for example, CVD (Chemical Vapor Deposition), PEP (Photo Engraving Process) and RIE (Reactive Ion Etching) in the memory cell area.

In FIG. 11, numerals 22a, 22b and 22c designate gate insulating films (e.g., silicon oxide films), numerals 32a, 32b and 32c denote cap insulating films (e.g., silicon nitride films), and numeral 33 indicates an insulating film (e.g., a so-called ONO film).

Next, thermal oxidation is performed, forming an oxide film 35 on the surfaces of the P-type semiconductor substrate 21, gate electrodes 23a and 23b, floating gate 23Ac and control gate 23Bc, as is illustrated in FIG. 12. Thereafter, ion implantation is carried out.

As for the low voltage transistors in the peripheral circuit area (e.g., N-channel MISFETs that operate at 2.5V and constitute a CMOS circuit), phosphorus (P) ions and arsenic (As) ions are implanted into the substrate 21, by means of self-alignment contact technique using the gate electrodes 23a as a mask. The dose of arsenic is, for example, $1 \times 10^{14}$ $cm^{-2}$ or more. The dose of phosphorus is smaller, about ten times as less than the dose of arsenic. These impurities will be activated, forming diffusion layers (LDDs) 26a, when annealing is performed later.

As for the high-voltage transistors in the peripheral circuit (e.g., N-channel MISFETs that have a drain breakdown voltage of 10V or more and constitute a circuit for driving the memory cells), phosphorus (P) are ion-implanted to the substrate 21. This ion implantation is effected by means of self-alignment contact technique using the gate electrodes 23b as a mask. The dose of phosphorus is smaller than that applied to form the low voltage transistors, for example about $5 \times 10^{13}$ $cm^{-2}$. This impurity will be activated, forming diffusion layers (LDDS) 26b, when annealing is performed later.

As for the memory cells in the memory cell area (e.g., memory cells of a NOR-type flash EEPROM), ion implantation is carried out to form the source diffusion layers and drain diffusion layers. For example, arsenic and phosphorus are ion-implanted into the substrate 21 to form the source diffusion layers, and arsenic and boron (B) are ion-implanted into the substrate 21 to form drain diffusion layers. These impurities will be activated, forming source diffusion layers 26cN and 27c and drain diffusion layers 26cP and 27c.

Figure 13:
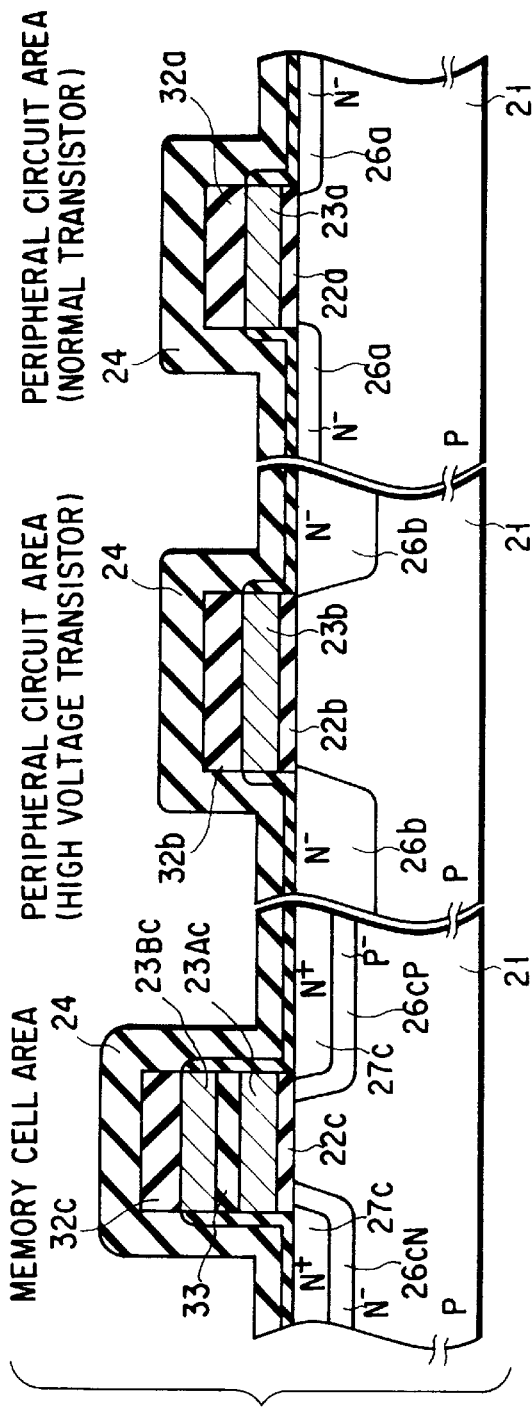

Then, as shown in FIG. 13, LPCVD (Low-Pressure Chemical Vapor Deposition) is effected, forming a silicon nitride film 24 on the entire surface of the semiconductor substrate 21. Made of silicon nitride, the film 24 has a lower etching rate than the pre-metal dielectric (later described). The silicon nitride film 24 has a thickness T1 (e.g., about 100 nm). RIE is then performed, etching back the silicon nitride film 24.

Figure 14:
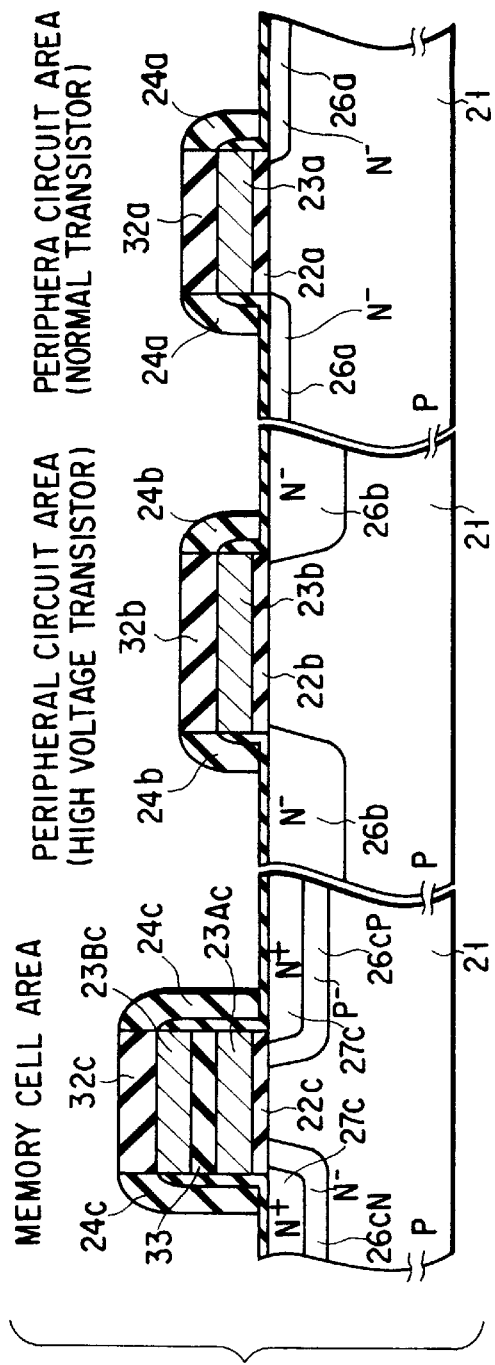

The structure shown in FIG. 14 is thereby obtained. As shown in FIG. 14, a side-wall film 24a is formed on the sides of the gate electrode 23a of each low voltage transistor formed in the peripheral circuit area. A side-wall film 24b is formed on the sides of the gate electrode 23b of each high-voltage transistor formed in the peripheral circuit area. And a side-wall film 24c is formed on the sides of the floating gate electrode 23Ac and control gate electrode 23Bc of each memory cell formed in the memory cell area.

The side-wall films 24a, 24b and 24c have a thickness (width) substantially equals to the thickness T1 of the silicon nitride film 24.

Next, a resist pattern 36 is formed on the semiconductor substrate 21 as shown in FIG. 15. The resist pattern 36 will be used as a mask in the ion implantation to form diffusion layers having a high impurity concentration in each low voltage transistor. The resist pattern 36 has openings that expose those parts of the peripheral circuit area in which the low voltage transistors are provided.

Using the gate electrodes 23a, side-wall films 24a and resist pattern 36 as a mask, arsenic are ion-implanted into the substrate 21 at the dose of about $5 \times 10^{15}$ $cm^{-2}$ by means of self-alignment contact technique. Thereafter, the resist pattern 36 is removed. This impurity, i.e., arsenic, will be activated, forming source diffusion layers 27a (sources and drains).

Hence, the low voltage transistors formed in the peripheral circuit area have an LDD length that is substantially equal to the thickness T1 (e.g., 100 nm) of the side walls 14n and have their parasitic resistance decreased. The low voltage transistors can be high-performance MISFETs.

Next, as illustrated in FIG. 16, LPCVD is carried out, forming a silicon oxide film on the entire surface of the semiconductor substrate 21. The silicon oxide film has a thickness T2 (e.g., about 100 nm) and is made of material that has an etching rate substantially equal to that of the pre-metal dielectric (later described). Then, RIE is performed, thereby etching back the silicon oxide film. As a result, in the peripheral circuit area, a side-wall film 25a is formed on the sides of the side-wall film 24a of each low voltage transistor, and a side-wall film 25b is formed on the sides of the side-wall film 24b of each high-voltage transistor. Further, a side-wall film 25c is formed on the sides of the side-wall film 24c of each memory cell in the memory cell area.

The side-wall films 25a, 25b and 25c have a thickness (width) that is substantially equal to the thickness T2 of the silicon oxide film. The silicon oxide film may be doped with phosphorus, thereby to reduce the influence of movable ions in the silicon oxide film.

Thereafter, a resist pattern 37 is formed on the substrate 21 as shown in FIG. 17, in order to form diffusion layers of a high impurity concentration, for each high-voltage transistor that is provided in the peripheral circuit area. The resist pattern 37 has openings that expose those parts of the peripheral circuit area in which the high-voltage transistors are provided.

Using the gate electrodes 23b, side-wall films 24b and 25b and resist pattern 37 as a mask, arsenic are ion-implanted into the substrate 21 at the dose of about $5 \times 10^{15}$ $cm^{-2}$ by means of self-alignment contact technique. Thereafter, the resist pattern 37 is removed. This impurity, i.e., arsenic, will be activated, forming source diffusion layers 27a (sources and drains).

Each high-voltage transistor thus provided in the peripheral circuit area has an LDD length that is substantially equal to the sum (e.g., 200 nm), T1+T2, of the thickness T1 of the side-wall film 24b and the thickness T2 of the side-wall film 25b. The high-voltage transistors are, therefore, MISFETs that have a drain breakdown voltage of 10V or more.

Next, as illustrated in FIG. 18, LPCVD is performed, forming a pre-metal dielectric 28 on the entire surface of the semiconductor substrate 21. The pre-metal dielectric 28 covers the memory cells and the MISFETs. The insulator 38 is, for example, a silicon oxide film (BPSG film) that contains boron and phosphorus. Then, a process, such as CMP (Chemical Mechanical Polishing), is carried out, rendering the surface of the pre-metal dielectric 28 flat.

Further, PEP is effected, forming a resist pattern 38 on the pre-metal dielectric 28. The resist pattern 38 consists of two contact-hole patterns. The first contact-hole pattern is designed to make contact holes that will reach the drain diffusion layers of the memory cells. The second contact-hole pattern is designed to make contact holes that will reach the diffusion layers of the MISFETs formed in the peripheral circuit area.

The flash EEPROM depicted in FIGS. 9 and 10 is designed to have the following dimensional features. First, the gate electrode 23a of each low voltage transistor provided in the peripheral circuit area is spaced from the corresponding opening 38a of the resist pattern by a distance of about 100 nm (about the thickness T1 of the side-wall film 24a). Second, the gate electrode 23b of each high-voltage transistor provided in the peripheral circuit area is spaced from the corresponding opening 38b of the resist pattern by a distance T (=T1+T2+α), where is the margin to compensate for a resist alignment error that may occur in photolithography. Third, the control gate electrode 23Bc of each memory cell provided in the memory cell area is spaced from the corresponding opening 38c of the resist pattern by a distance of about 100 nm (about the thickness T1 of the side-wall film 24c).

Figure 19:
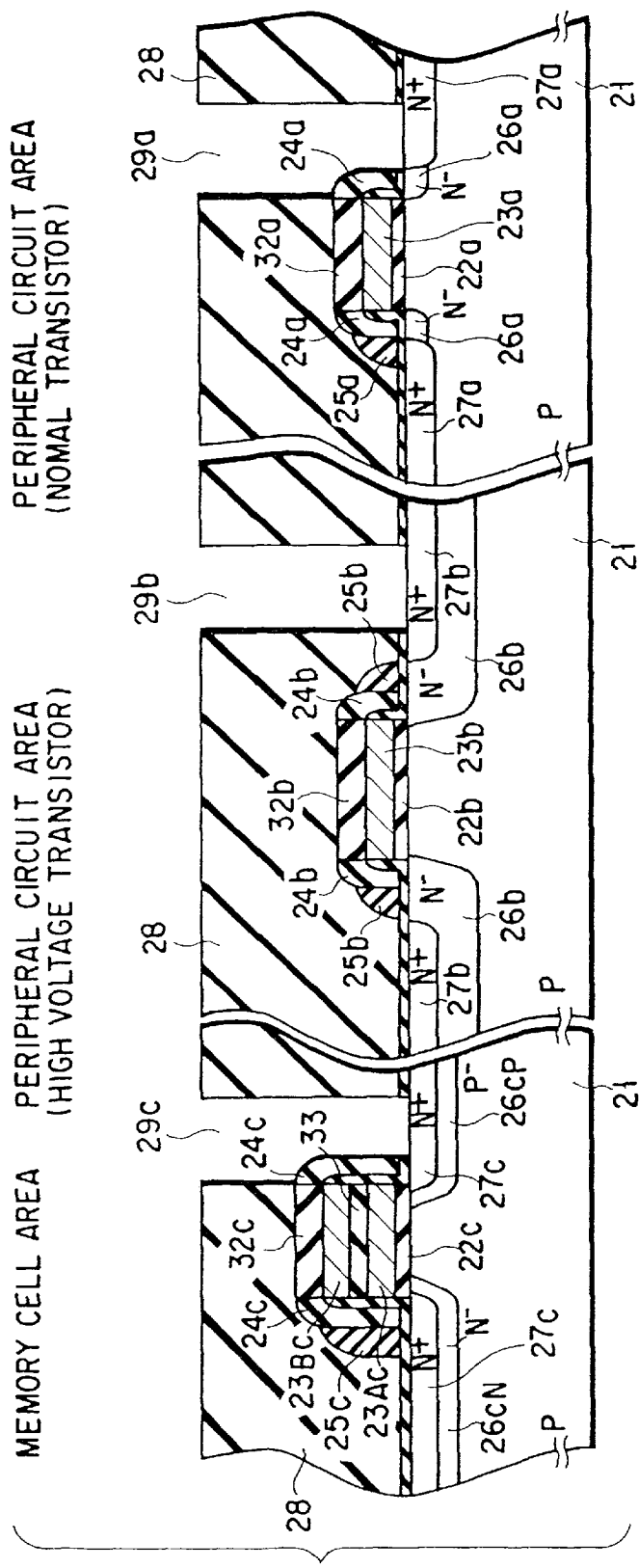

Thereafter, using the resist pattern 38 as a mask, RIE is effected, thereby etching the pre-metal dielectric 28. Contact holes 29a, 29b and 29c are thereby made in the pre-metal dielectric 28, as is illustrated in FIG. 19. Then, the resist pattern 38 is removed.

In each low voltage transistor provided in the peripheral circuit area, the opening 38a of the resist pattern may deviate about 100 nm toward the gate electrode 23a as shown FIG. 19 due to the resist alignment error in photolithography. Even in this case, the gate electrode 23a is not exposed in the contact hole 29a since the side-wall film 24a covers the gate electrode 23a.

The side-wall film 25a has the same etching rate as the pre-metal dielectric 28. Therefore, the film 25a does not remain in the contact hole 29a that is formed by etching the pre-metal dielectric 28. Hence, that part of the semiconductor substrate 21, which is exposed through the contact hole 29a, has a large contact area. This decreases the contact resistance of the low voltage transistor.

In each high-voltage transistor in the peripheral circuit area, a margin α is provided to compensate for a resist alignment error that may occur in photolithography. It follows that, even if the opening 38b of the resist pattern deviates about 100 nm toward the gate electrode 23b due to the resist alignment error in photolithography, neither the side-wall film 24b nor the side-wall film 25b will be etched.

In each memory cell in the memory cell area, the opening 38c of the resist pattern may deviate about 100 nm toward the gate electrode 23c due to a resist alignment error in photolithography. Even when this happens, neither the floating gate electrode 23Ac nor the control gate electrode 23Bc will be exposed in the contact hole 29c since the side-wall film 24c covers both the floating gate electrode 23Ac and the control gate electrode 23Bc.

The side-wall film 25c and the pre-metal dielectric 28 have the same etching rate. Hence, the film 25c does not remain in the contact hole 29c that is formed by etching the pre-metal dielectric 28. Hence, that part of the semiconductor substrate 21, which is exposed through the contact hole 29c, has a large contact area. This decreases the contact resistance of the memory cell.

Figure 20:
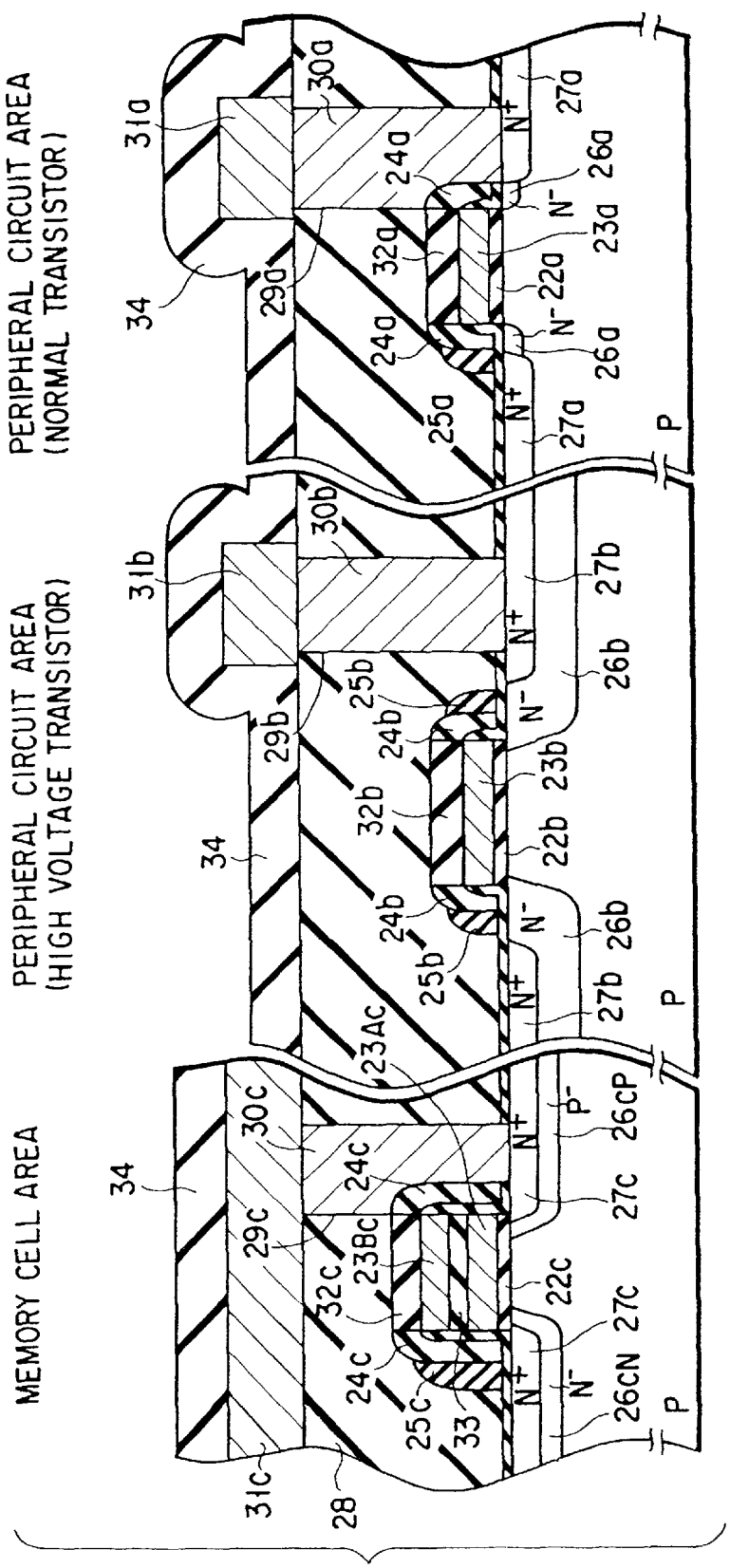

Next, as shown in FIG. 20, contact plugs 30a, 30b and 30c made of, for example, tungsten are formed in the contact holes 29a, 29b and 29c, respectively. More precisely, the contact plugs 30a to 30c are formed in the contact holes 29a to 29c only, by means of CVD and CMP. Metal wires 31a, 31b and 31c are formed on the contact plugs 30a, 30b and 30c, respectively. An interlayer insulator 34 is formed on the pre-metal dielectric 28, covering the metal wires 31a to 31c.

In the peripheral circuit area of the flash EEPROM manufactured by the method described above, those edges of the diffusion layers 26a and 26b, which are adjacent to the gate electrodes 23a and 23b, substantially align with the edges of the gate electrodes 23a and 23b. Practically, however, those edges of diffusion layers 26a and 26b horizontally extend, in part, beneath the gate electrodes 23a and 23b for some distance due to the thermal oxidation effected after the ion implantation. Similarly, those edges of diffusion layers 27a and 27b, which are adjacent to the gate electrodes 23a and 23b, substantially align with the edges of the side-wall films 24a and 25b. However, the edges of the layers 27a and 27b horizontally extend, in part, beneath the side-wall films 24a and 25b for some distance due to the thermal oxidation effected after the ion implantation.

The semiconductor device and the method of manufacturing the same, which have been described with reference to FIGS. 8 to 20, are advantageous in the following respects.

As indicated above, a side wall composed of two or more side-wall films of different materials is provided on the sides of the gate electrode of each MISFET. More specifically, the side wall consists of a first side-wall film having a lower etching rate than the pre-metal dielectric and a second side-wall film having substantially the same etching rate as the pre-metal dielectric.

Further, in each low voltage transistor operating at a low voltage, only the first side-wall film exists between the gate electrode and the contact plug made in the contact hole, and the second side-wall film does not exists there. In addition, the diffusion layers that function as LDDS are provided right below the first side-wall film only. The low voltage transistors can serve to enhance the integration density of the LSI, without having their contact resistance increased due to the sell-aligned contact and short LDD length.

In each of the high-voltage transistors operating at a high voltage, the contact hole overlaps neither the first side-wall film nor the second side-wall film. And the diffusion layers that function as LDDs are provided right below both the first side-wall film and the second side-wall film. Thanks to the long LDD length, the high-voltage transistors can have a drain breakdown voltage of 10V or more.

In each of the memory cells provided in the memory cell area, only the first side-wall film exists between the gate electrode and the contact plug made in the contact hole. The second side-wall film does not exists there. Furthermore, the diffusion layers that function as LDDs are provided right below the first side-wall film only. The memory cells can therefore be arranged in high integration density, without having their contact resistance increased due to their self-aligned contacts.

Thus, the present invention can form, on one and the same substrate, MISFETs (including memory cells) which should be arranged in high integration density by virtue of self-alignment contact technique and also MISFETs which should have diffusion layers of sufficient breakdown voltage.

Figure 21:
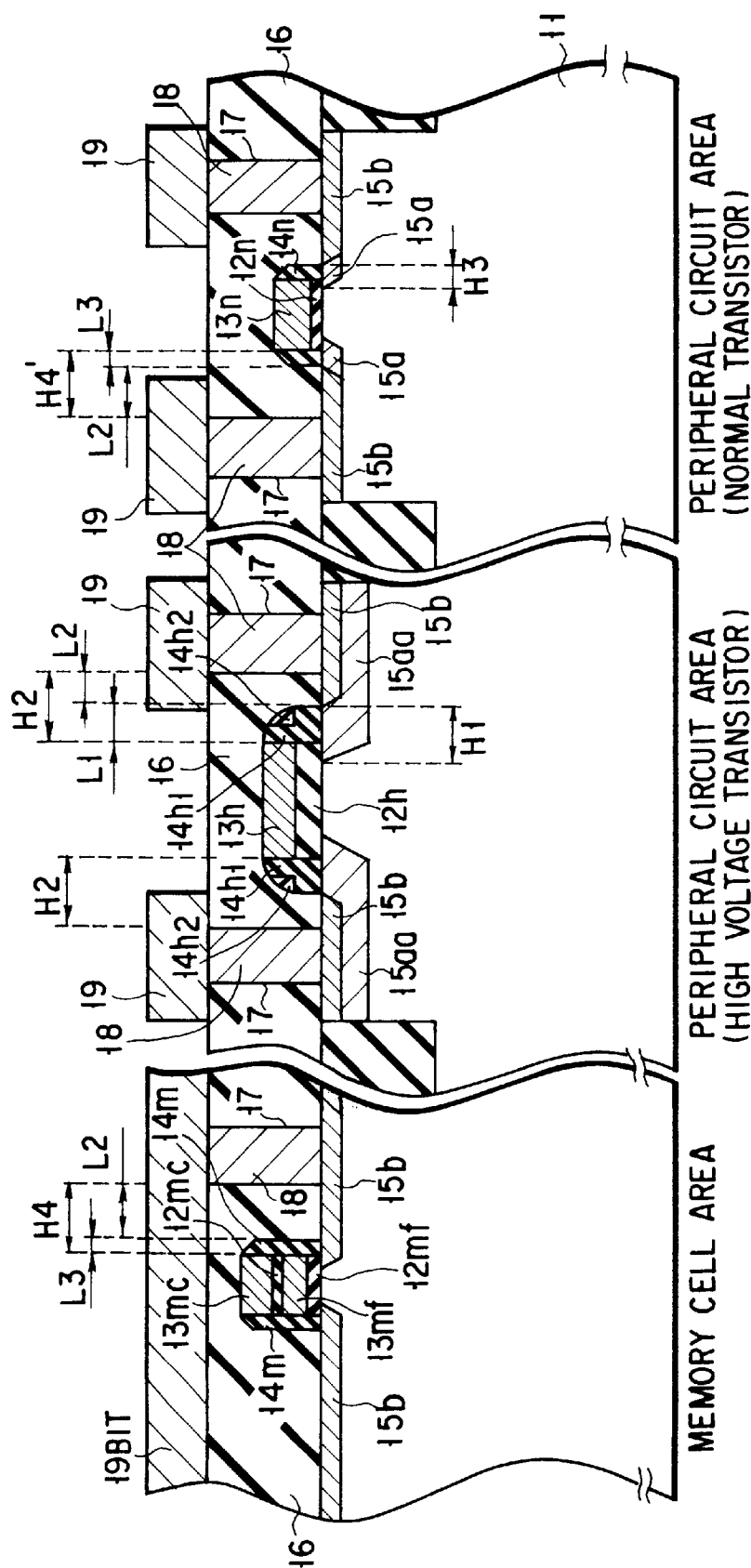
FIG. 21 is a sectional view showing MISFETs according to the present invention, which are incorporated in a NOR-type flash EEPROM.

FIG. 21 shows MISFETs according to the present invention, which are incorporated in a NOR-type flash EEPROM.

The memory cells arranged in the memory cell area of this NOR-type flash EEPROM will be described first.

Each memory cell has stacked gate structure. As shown in FIG. 21, a gate insulating film 12$mf$ is formed on a semiconductor substrate 11. A floating gate electrode 13$mf$ is formed on the gate insulating film 12$mf$. An insulating film 12$mc$ is formed on the floating gate electrode 12$mf$. A control gate electrode 13$mc$ is provided on the insulating film 12$mc$. An insulating film 14$m$ called "side wall" is formed on the sides of the floating gate electrode 13$mf$ and control gate electrode 13$m$.

The side wall 14$m$ has a thickness L3 of, for example, about 100 nm. As far as the memory cell is concerned, the side wall 14$m$ is unnecessary. Nevertheless, the memory cell has a side wall formed on the sides of the gate electrodes 13$mf$ and 13$mc$ in order to facilitate or simplify the processing of the wafer, more precisely to reduce the number of times EPE is performed. In practice, the thickness L3 of the side wall 14$m$ is equal to the thickness of the side-wall insulating films that are provided on the sides of the low voltage transistors arranged in the peripheral circuit area. The peripheral circuit area will be described later.

The memory cells of the NOR-type flash EEPROM shown in FIG. 21 are of so-called "channel-erasing type." In each memory cell, electrons are moved from the floating gate into the substrate (i.e., channel) to erase data. This is why diffusion layers 15, which are the source and drain of the memory cell, are formed in the semiconductor substrate 11. On the semiconductor substrate 11, a pre-metal dielectric 16 is formed, completely covering the memory cells of stacked structure. The pre-metal dielectric 16 has a contact hole 17 that reaches one of the diffusion layers 15$b$, which is the drain. A contact plug 18 made of, for example, tungsten (W), is formed in the contact hole 17. A metal wire 19 is provided on the contact plug 18.

The side wall 14$m$ is made of a silicon oxide film, a silicon nitride film or the like. The pre-metal dielectric 16 is made of a silicon oxide film. In the case where the side walls 14$m$ is made of silicon oxide film, there may occur an error in the alignment of the gate electrodes 13$mf$ and 13$mc$ with respect to the contact hole 17. If an alignment error occurs, there will arise the risk that gate electrodes 13$mf$ and 13$mc$ are short-circuited with the contact plug 18 made in the contact hole 17.

The side wall 14$m$ may be made of silicon nitride film. In this case, the side wall 14$m$ overlaps the contact hole 17. If this happens, the area (contact area) at which one diffusion layer 15$b$ is exposed at the bottom of the contact hole 17 will decrease. This increases the contact resistance at the interface between the contact plug 18 and this diffusion layer 15$b$.

To prevent the contact resistance from increasing, a sufficiently large margin (width) H4 is provided between the gate electrodes 13$mf$ and 13$mc$, on the one hand, and the contact hole 17, on the other.

However, the margin H4 should be as small as possible in order to make each memory cell smaller, thereby to increase the storage capacity of the NOR-type flash EEPROM or reduce the size of the EEPROM chip. Therefore, the margin H4 needs to be set more precisely than any other margin in the memory cell area, in order not only to decrease the contact resistance but also to make the memory cell smaller.

The margin H4 is, for example, the sum of the thickness L3 of the side wall 14$m$ and the margin L2 between the side wall 14$m$ and the contact hole 17. The margin L2 is determined from the accuracy of aligning a mask in the photo engraving process (PEP) and the dimensional precision of the contact hole 17.

In the NOR-type flash EEPROM of FIG. 21, the thickness L3 of the side wall 14$m$ is set at the value of, for example, 0.1 μm. (In the conventional NOR-type flash EEPROM of FIG. 7, the side wall has a thickness of 0.2 μm.) Hence, if the margin L2 between the side wall 14$m$ and the contact hole 17 is 0.2 μm, the margin (width) H4 between the gate electrodes 13$mf$ and 13$mc$, on the one hand, and the contact hole 17, on the other will be 0.3 μm. (In the conventional EEPROM of FIG. 7, the margin H4 is 0.4 μm.)

Figure 1:
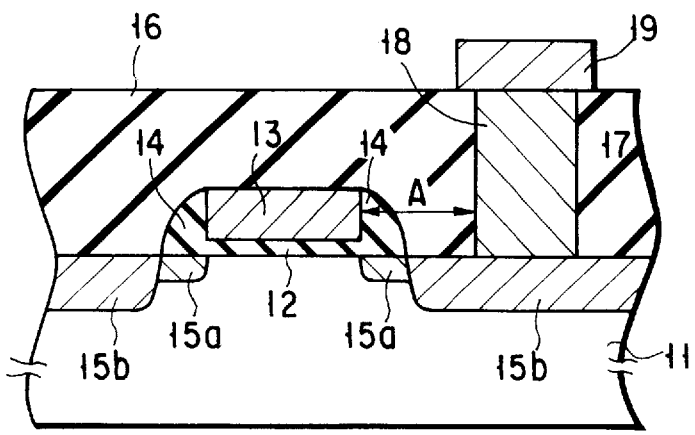
FIG. 1 is a sectional view showing a conventional MISFET.
Figure 2:
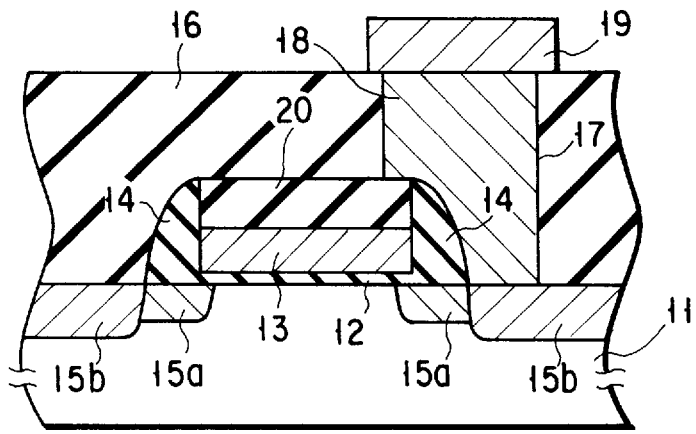
FIG. 2 is a sectional view depicting another type of a conventional MISFET.
Figure 3:
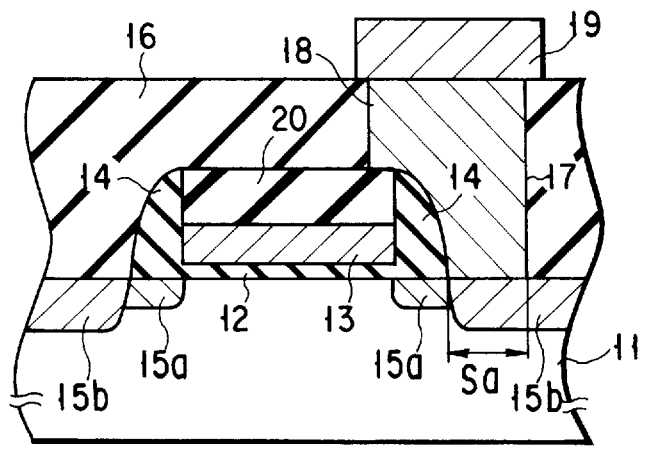
FIG. 3 is a sectional view showing still another type of a conventional MISFET.
Figure 7:
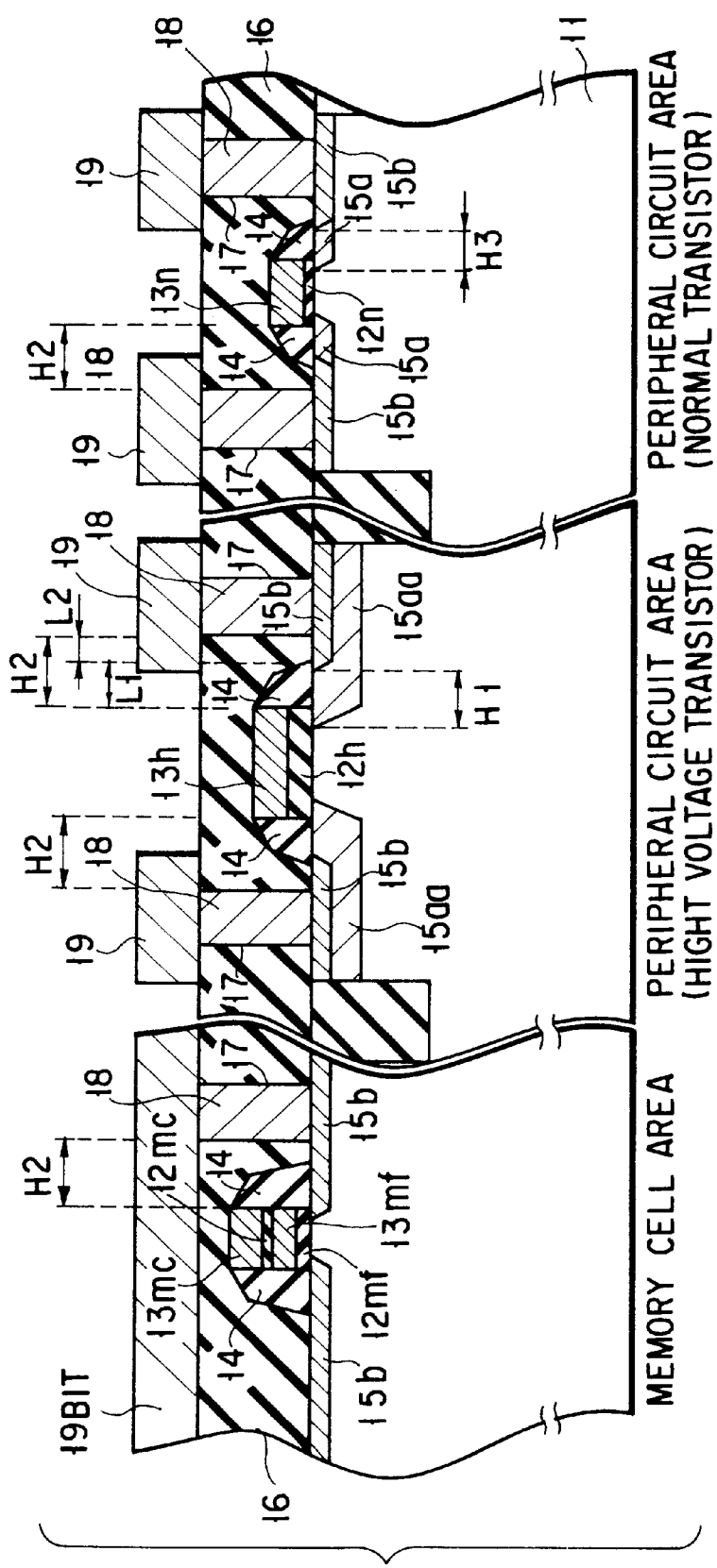
FIG. 7 is a sectional view showing conventional MISFETs incorporated in a flash memory.

Thus, each memory cell occupies a smaller area in the NOR-type flash EEPROM of FIG. 21 than in the conventional NOR-type flash EEPROM (FIG. 7). This means that the NOR-type flash EEPROM of FIG. 21 can have a greater storage capacity or a smaller chip size.

The high-voltage transistors arranged in the periphery circuit area of this NOR-type flash EEPROM will now be described.

The high-voltage transistors operate at a voltage higher than the power-supply voltage VCC (3.3V, 5V or the like), which ranges, for example, from 6V to 20V.

Gate insulating films 12$h$ are provided on the semiconductor substrate 11. Gate electrodes 13$h$ are provided on the gate insulating films 12$h$. The gate insulating films 12$h$ are, for example, about 20 nm thick, or thick enough not to undergo dielectric breakdown when applied with the high voltage. An insulating film called "side wall" is provided on the sides of the gate insulating film 12$h$ and gate electrode 13$h$ of each high-voltage transistor. The side wall consists of side-wall films 14$h$1 and 14$h$2.

The side-wall film 14$h$1 has a thickness of, for example, about 100 nm. The side-wall film 14$h$2 has a thickness of, for example, about 100 nm, too. Therefore, the side wall has a thickness (width) L1 of about 200 nm. The NOR-type flash EEPROM is characterized in that the side wall composed of two films 14$h$1 and 14$h$2 of different materials is formed on the sides of the gate insulating film 12$h$ and gate electrode 13$h$ of each high-voltage transistor. The inner side-wall film 14$h$1, which contacts the sides of the gate insulating film 12$h$ and gate electrode 13$h$, is made of the same material and has the same thickness, as the side wall 14$m$ of the memory cell and the side wall 14$n$ of each low voltage transistor. The outer side-wall film 14$h$2 is provided around only the gate electrode 13$h$ of the high-voltage transistor, not around the gate insulating film 12$h$.

Diffusion layers 15$aa$ having low impurity concentration, called "LDDs (Lightly Doped Drains)," are formed in the surface of the semiconductor substrate 11. And diffusion layers 15$b$ (sources and drains) are formed in the diffusion layers 15$aa$, respectively. The diffusion layers 15$b$ have a higher impurity concentration than the diffusion layers 15$aa$.

The diffusion layers 15$aa$ are deep so that the breakdown voltage at the p-n junction of each high-voltage transistor may be higher than the operating voltage of the high-voltage transistor. Only diffusion layers 15$aa$ are formed in those parts of the substrate 11, which lie right below the side-wall films 14$h$1 and 14$h$2. The diffusion layers 15$aa$ have a length H1 that is proportional to the total thickness L1 of the side-wall films 14$h$1 and 14$h$2. The thickness H1 is sufficiently large (e.g., about 0.2 μm) so that the breakdown voltage at the p-n junction of each high-voltage transistor may be higher than the operating voltage of the high-voltage transistor.

The thickness of the diffusion layers 15aa and the total thickness L1 of the side-wall films 14h1 and 14h2 influence the width of the depletion layer that develops in the p-n junction area of each high-voltage transistor. The greater the thickness of the layers 15aa and the total thickness L1, the broader the depletion layer and, hence, the higher the breakdown voltage of the high-voltage transistor.

A pre-metal dielectric 16 is formed on the semiconductor substrate 11. The insulator 16 completely covers the MIS-FETS. The pre-metal dielectric 16 has contact holes 17, each reaching a diffusion layer 15b. Contact plugs 18 made of, for example, tungsten (W), are formed in the contact holes 17. Metal wires 19 are provided on the contact plugs 18, respectively.

In each high-voltage transistor, the contact hole 17 is positioned, not overlapping the side-wall film 14h1 or the side-wall film 14h2. The margin (width) H2 between the gate electrode 13h and the contact hole 17 is the sum of the thickness L1, i.e., the total thickness of the films 14h1 and 14h2, and the margin L2 between the films 14h1 and 14h2, on the one hand, and the contact hole 17, on the other. The margin L2 is determined from the accuracy of aligning a mask in the photo engraving process (PEP) and the dimensional precision of the contact hole 17.

As described above, the total thickness L1 of the side-wall films 14h1 and 14h2 is, for example, about 0.2 μm. (The thickness L1 is also 0.2 μm in the conventional EEPROM shown in FIG. 7.) Thus, the margin (width) H2 between the gate electrode 13h and the adjacent contact hole 17 will be 0.4 μm if the margin L2 between the films 14h1 and 14h2, on the one hand, and the contact hole 17, on the other, is 0.2 μm. (The margin H2 is also 0.4 μm in the conventional EEPROM shown in FIG. 7.) Thus, the high-voltage transistors according to this invention can have its p-n junction breakdown voltage increased due to the long LDD length and the deep diffusion layers of low impurity concentration, in the same way as the conventional high-voltage transistors.

The low voltage transistors provided in the peripheral circuit area will now be described.

The low voltage transistors are ones which operate at the power-supply voltage VCC (3.3V or 5V) or at a voltage lower than the power-supply voltage VCC.

As shown in FIG. 21, gate insulating films 12n are provided on the semiconductor substrate 11. Gate electrodes 13n are provided on the gate insulating films 12h. An insulating film 14n called "side wall" is provided on the sides of each gate electrode 13n. Diffusion layers 15a having low impurity concentration, called "LDDs (Lightly Doped Drains)," are formed in the surface of the semiconductor substrate 11, two located right below one side wall 14n.

Adjacent to the respective diffusion layers 15a, diffusion layers 15b (sources and drains) are provided. The diffusion layers 15b have an impurity concentration higher than the diffusion layers 15a. A pre-metal dielectric 16 is formed on the semiconductor substrate 11, also in the peripheral circuit area. The insulator 16 completely covers the MISFETs. The pre-metal dielectric 16 has contact holes 17, each reaching one of the diffusion layers 15b of each low voltage transistor. A contact plug 18 made of, for example, tungsten (W), is formed in each contact hole 17. A metal wire 19 is provided on the contact plug 18.

The side wall 14n is made of a silicon oxide film, a silicon nitride film or the like. The pre-metal dielectric 16 is made of a silicon oxide film. In the case where the side walls 14n is made of silicon oxide film, there may occur an error in the alignment of the gate electrode 13n with respect to the contact hole 17. If an alignment error occurs, there will arise the risk that gate electrodes 13n is short-circuited with the contact plug 18 made in the contact hole 17.

The side wall 14n may be made of silicon nitride film. In this case, the side wall 14n overlaps the contact hole 17. If this happens, the area (contact area), at which one diffusion layer 15b is exposed at the bottom of the contact hole 17, will decrease. This increases the contact resistance at the interface between the contact plug 18 and this diffusion layer 15b.

To prevent the contact resistance from increasing, a sufficiently large margin (width) H4' is provided between the gate electrode 13n and the contact hole 17. The margin H4' is, for example, the sum of the thickness L3 of the side wall 14n and the margin L2 between the side wall 14n and the contact hole 17. The margin L2 is determined from the accuracy of aligning a mask in the photo engraving process (PEP) and the dimensional precision of the contact hole 17.

In the NOR-type flash EEPROM of FIG. 21, the thickness L3 of the side wall 14n is set at the value of, for example, 0.1 μm. (In the conventional NOR-type flash EEPROM of FIG. 7, the side wall has a thickness of 0.2 μm.) Hence, if the margin L2 between the side wall 14n and the contact hole 17 is 0.2 μm, the margin (width) H4' between the gate electrode 13n and the contact hole 17 will be 0.3 μm. (In the conventional EEPROM of FIG. 7, the margin H4 is 0.4 μm.)

That is, each low voltage transistor occupies a smaller area than the low voltage transistor of the conventional structure. In addition, its on-resistance is low by virtue of the short LDD length.

The method of manufacturing the flash EEPROM depicted in FIG. 21 will now be explained.

Figure 22:
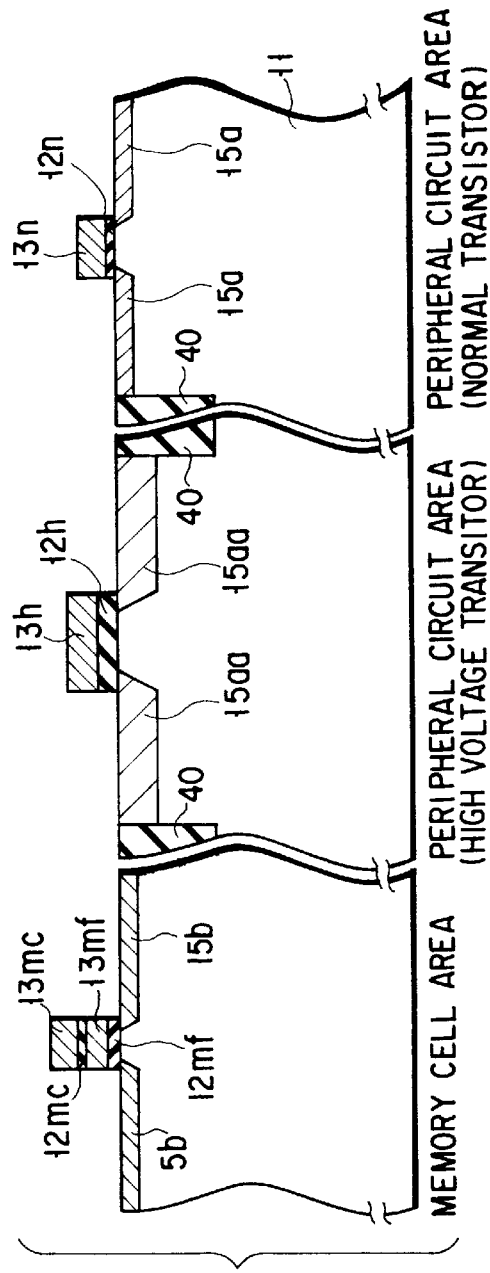

First, as shown in FIG. 22, an element-isolating insulating film 40 having STI (Shallow Trench Isolation) structure is formed in the surface of the silicon substrate 11 (or a well region). More precisely, trenches are cut in the surface of the silicon substrate 11, an insulating film is formed in the trenches and on the surface of the substrate 11, and CMP (Chemical Mechanical Polishing) is carried out. As a result, the parts of the insulating film, other than those formed in the trenches, are removed.

Then, gate oxide films 12n and gate insulating films 12h, respectively for low voltage transistors and high-voltage transistors, are formed in the peripheral circuit area. In the memory cell area, gate insulating films 12mf are formed for memory cells. The gate insulating films 12h for the high-voltage transistors are thinner than the gate insulating films 12n for the low voltage transistors and the gate insulating films 12mf for the memory cells.

In the peripheral circuit area, gate electrodes 13n are formed on the gate insulating films 12n for the low voltage transistors, and gate electrodes 13h are formed on the gate insulating films 12h for the high-voltage transistors. In the memory cell area, floating gate electrodes 13mf are formed on the gate insulating films 12mf for the memory cells, insulating films 12mc (e.g., ONO (Oxide/Nitride/Oxide) films) are formed on the floating gate electrodes 13mf, and control gate electrodes 13mc are formed on the insulating films 12mc.

The gate electrodes 13n and 13h, floating gate electrodes 13mf and control gate electrodes 13mc are formed by known techniques. The gate electrodes 13n and 13h may be formed by, for example, CVD (Chemical Vapor Deposition), PEP (Photo Engraving Process) and RIE (Reactive Ion Etching) in the peripheral circuit area. The floating gate electrodes 13mf and control gate electrodes 13mc may be formed by, for example, CVD, PEP and RIE in the memory cell area.

Next, thermal oxidation is performed, forming a thin oxide film (not shown) on the surfaces of the semiconductor substrate 11, gate electrodes 13n and 13h, floating gate electrodes 13mf and control gate electrodes 13mc. Thereafter, ion implantation is carried out.

As for the low voltage transistors in the peripheral circuit area (e.g., N-channel MISFETs that operate at 2.5V and constitute a CMOS circuit), phosphorus (P) ions and arsenic (As) ions are implanted into the substrate 11, by means of self-alignment contact technique using the gate electrodes 13n as a mask. The dose of arsenic is, for example, $1 \times 10^{14}$ cm$^{-2}$ or more. The dose of phosphorus is smaller, about ten times as less than the dose of arsenic. These impurities will be activated, forming diffusion layers (LDDS) 15a, when annealing is performed later.

As for the high-voltage transistors in the peripheral circuit (e.g., N-channel MISFETs that have a drain breakdown voltage of 10V or more and constitute a circuit for driving the memory cells), phosphorus (P) are ion-implanted to the substrate 11. This ion implantation is effected by means of self-alignment contact technique using the gate electrodes 13h as a mask. The dose of phosphorus is smaller than that applied to form the low voltage transistors, for example about $5 \times 10^{13}$ cm$^{-2}$. This impurity will be activated, forming diffusion layers (LDDS) 15aa, when annealing is performed later.

The diffusion layers 15aa contain the phosphorus that has been ion-implanted into the substrate 11. Therefore, the diffusion layers 15aa are deeper than the diffusion layers 15a of each low voltage transistor. The diffusion layers 15aa have a lower impurity concentration than the diffusion layers 15a. Hence, the diffusion layers 15aa serve to broaden the depletion layer that has developed in the p-n junction of each high-voltage transistor and in the vicinity of the p-n junction. This helps increase the breakdown voltage of the source/drain diffusion layers of the high-voltage transistor.

As for the memory cells in the memory cell area (e.g., memory cells of a NOR-type flash EEPROM), ion implantation is carried out to form the source/drain diffusion layers. For example, arsenic and phosphorus are ion-implanted into the substrate 11 to form the source/drain diffusion layers 15b in the memory cell area, by using the control gate electrodes 13mc and floating gate electrodes 13mf as a mask. These impurities will be activated, forming source/drain diffusion layers 15b.

Figure 23:
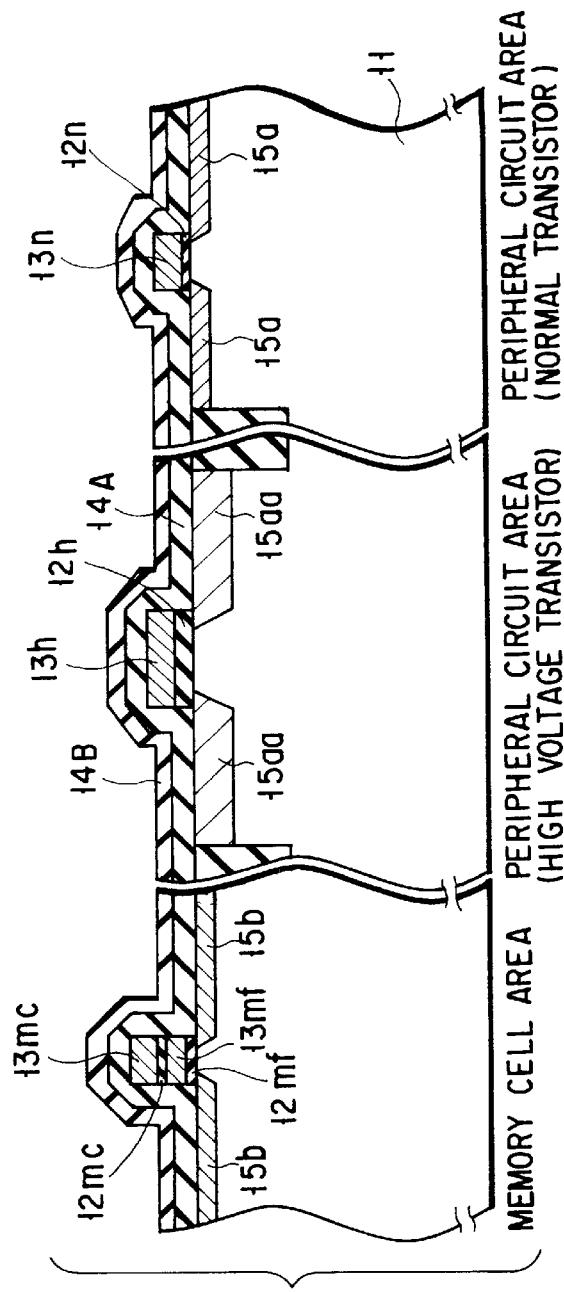

Then, as shown in FIG. 23, LPCVD (Low-Pressure Chemical Vapor Deposition) is effected, forming a silicon nitride film 14A on the entire surface of the semiconductor substrate 11. Made of silicon nitride, the film 14A has a lower etching rate than the interlayer does insulator (later described). The silicon nitride film 14A has a thickness T1 (e.g., about 100 nm). Further, is performed, forming a silicon oxide film 14B on the entire surface of the silicon nitride film 14A. The silicon oxide film 14B has substantially the same etching rate as the premetal dielectric and a thickness T2 (e.g., about 100 nm). RIE is then performed, etching the silicon oxide film 14B.

The structure shown in FIG. 24 is thereby obtained. As shown in FIG. 24, silicon oxide films 14h2 are formed at the stepped parts of the silicon nitride film 14A, which are located near the gate electrodes 13n, 13h, 13mf and 13mc of the transistors. Then, a photoresist film 41 is formed, covering the areas in which the high-voltage transistors are formed.

Wet etching (e.g., wet etching using solution of ammonium fluoride) is carried out, etching the silicon oxide films 14h2 from the stepped parts of the silicon nitride film 14A, which are located near the gate electrodes 13n, 13h, 13mf and 13mc of the transistors.

Next, RIE is effected, etching the silicon nitride film. As shown in FIG. 25, side walls are thereby formed on the sides of the gate electrodes 13n, 13h, 13mf and 13mc of the transistors.

As indicated above, the wet etching has completely removed the silicon oxide films from the memory cell area and those areas in which the low voltage transistors are formed in the peripheral circuit area. A side wall composed of a silicon nitride film 14n only is therefore formed on the sides of the gate electrode 13n of each low voltage transistor. Thus, the side wall provided in the low voltage transistor has a width substantially equal to the thickness of the silicon nitride film 14n. (In the flash EEPROM of FIG. 21, the side wall has a width of about 100 nm.)

During the wet etching, the photoresist film protects the silicon oxide films formed on the areas in which the high-voltage transistors are formed in the peripheral circuit area. A side wall composed of a silicon nitride film 14h1 and a silicon oxide film 14h2 is, therefore, formed on the sides of the gate electrode 13h of each high-voltage transistor. It follows that the side wall of each high-voltage transistor has a width L1 is substantially equal to the sum of the thickness of the silicon nitride film 14h1 and the thickness of the silicon oxide film 14h2. (In the flash EEPROM of FIG. 21, the thickness L1 is about 200 nm.)

Thereafter, the memory cell area is covered with a photoresist film. Ion implantation is effected at the areas in which the low voltage transistors are formed, by using the gate electrodes 13n and side walls 14n as a mask. At the areas in which the high-voltage transistors are formed, ion implantation is carried out by using the gate electrodes 13h and side walls 14h1 and 14h2 as a mask. Both steps of implanting ions may be effected, for example, at the same time.

The impurity applied in the steps of implanting ions is, for example, arsenic. Arsenic is ion-implanted into the semiconductor substrate 11 at a dose of, for example, about $5 \times 10^{13}$ cm$^{-2}$. After the ion implantation completes, the photoresist film is removed. Annealing is performed, activating the arsenic. As a result, the diffusion layers 15a (sources and drains) for the low voltage transistors and the diffusion layers 15b (sources and drains) for the high-voltage transistors are formed in the peripheral circuit area.

Hence, the low voltage transistors formed in the peripheral circuit area have an LDD length that is substantially equal to the thickness T1 (e.g., 100 nm) of the side walls 14n and have their parasitic resistance decreased. The high-voltage transistors formed also in the peripheral circuit area have an LDD length that is substantially equal to T1+T2 (e.g., 200 nm), where T1 is the thickness of the side wall 14h1 and T2 is the thickness of the side wall 14h2. Further, the source and drain of each high-voltage transistor have their breakdown voltage increased, whereby the high-voltage transistor can be a high-performance MISFET.

Next, as shown in FIG. 26, LPCVD is performed, thereby forming a pre-metal dielectric 16 on the entire surface of the semiconductor substrate 11. The pre-metal dielectric 16 covers the memory cells and the MISFETs. The insulator 16 is, for example, a silicon oxide film (BPSG film) which contains boron and phosphorus. Then, a process, such as CMP (Chemical Mechanical Polishing), is carried out, rendering the surface of the pre-metal dielectric 16 flat.

Further, PEP is effected, forming a resist pattern on the pre-metal dielectric 16. The resist pattern consists of two contact-hole patterns. The first contact-hole pattern is designed to make contact holes that will reach the drain diffusion layers of the memory cells. The second contact-hole pattern is designed to make contact holes that will reach the diffusion layers of the MISFETs formed in the peripheral circuit area.

In each low voltage transistor provided in the peripheral circuit area, the margin H4' between the gate electrode 13n and the corresponding opening in the resist pattern (i.e., contact hole) is, for example, the sum of the margin L2 and the thickness L3 of the side wall 14n. The margin L2 is determined from the alignment error made in the course of processing the wafer and the size of the low voltage transistors.

In each high-voltage transistor provided in the peripheral circuit area, the margin H2 between the gate electrode 13n and the corresponding opening in the resist pattern (i.e., contact hole) is, for example, the sum of the margin L2 and the total thickness L1 of the side-wall films 14h1 and 14h2. The margin L2 is determined from the alignment error made in the course of processing the wafer and the size of the low voltage transistors.

In each memory cell provided in the peripheral circuit area, a margin H4 is provided between the gate electrodes 13mf and 13mc, on the one hand, and the opening of the resist pattern (i.e., the contact hole), on the other. This margin H4 is the sum of, for example, the margin L2 and the thickness L3 of the side wall 14m. As mentioned above, the margin L2 is determined from the alignment error made in the course of processing the wafer and the size of the low voltage transistors.

Using the resist pattern as a mask, RIE is effected, thereby etching the pre-metal dielectric 16. Contact holes 17 are thereby made in the pre-metal dielectric 16. Then, the resist pattern is removed.

Next, contact plugs 18 made of, for example, tungsten (W) are formed in the contact holes 17. To be more specific, CVD and CMP are carried out, forming the contact plugs 18 in the contact holes 17 only. Metal wires 19 are formed on the contact plugs 18, respectively.

In the peripheral circuit area of the flash EEPROM manufactured by the method described above, those edges of the diffusion layers 15a and 15aa, which are adjacent to the gate electrodes 13n and 13h, substantially align with the edges of the gate electrodes 13n and 13h. Practically, however, those edges of diffusion layers 15a and 15aa horizontally extend, in part, beneath the gate electrodes 13n and 13h for some distance due to the thermal oxidation effected after the ion implantation. Similarly, those edges of diffusion layers 15b, which are adjacent to the gate electrodes 13n and 13h, substantially align with the edges of the side walls 14h1 and 14h2. However, these edges of the layers 15b horizontally extend, in part, beneath the side walls 14h1 and 14h2 for some distance due to the thermal oxidation effected after the ion implantation.

The method explained with reference to FIGS. 22 to 26 may be modified as follows.

First, manufacturing steps are performed as in the above method and as shown in FIGS. 22 and 23, until a silicon oxide film 14B on the entire surface of the silicon nitride film 14A.

Next, as shown in FIG. 27, PEP is effected. A photoresist film 42 is thereby formed, covering the areas in which high-voltage transistors will be formed in the peripheral circuit area. Wet etching (e.g., wet etching using solution of ammonium fluoride) is then carried out, removing silicon nitride films 14B not covered with the photoresist film 42. Thus, the silicon nitride films 14B are completely removed from the areas in which low voltage transistors will be formed in the peripheral circuit area and from the areas in which memory cells will be formed in the memory cell area. Thereafter, the photoresist film 42 is removed.

Further, RIE is effected as shown in FIG. 28, etching a silicon nitride film from the areas in which the high-transistors will be formed, leaving silicon nitride films 14h2 in the stepped parts of a silicon oxide film 14A, which are adjacent to the gate electrodes 13h of the high-voltage transistors. The RIE is conducted in such conditions that only the silicon nitride film undergoes anisotropic etching, not etching the silicon oxide film 14A at all.

Thereafter, RIE is performed, etching the silicon oxide film 14A. As a result, a side wall is thereby formed on the sides of the gate electrode 13n and 13h of each high-voltage transistor. Also, a side wall is formed on the sides of the gate electrodes 13mf and 13mc of each memory cell. This RIE is conducted in such conditions that only the silicon nitride film undergoes anisotropic etching, not etching the silicon oxide film at all.

The structure shown in FIG. 25 is obtained. That is, a side wall composed of a silicon nitride film 14n only is formed on the sides of the gate electrode 13n of each low voltage transistor. A side wall composed of a silicon nitride film 14m is formed on the sides of the gate electrodes 13mf and 13mc of each memory cell. The side wall of the low voltage transistor has substantially the same thickness (about 100 nm) as the silicon nitride film 14n. The side wall of the memory cell has substantially the same thickness (about 100 nm) as the silicon nitride film 14m.

A side wall composted of a silicon nitride film 14h1 and a silicon oxide film 14h2 is formed on the sides of the gate electrode 13h of each high-voltage transistor. The side wall of the high-voltage transistor has a width L1, which is substantially equal to the sum of the thickness of the silicon nitride film 14h1 and the thickness of the silicon oxide film 14h2. (In this case, the width L1 is about 200 nm.)

Thereafter, the remaining manufacturing steps are performed as in the method explained above with reference to FIGS. 22 to 26, thereby obtaining the structure illustrated in FIG. 26.

The semiconductor device and the method of manufacturing the same, which have been described with reference to FIGS. 21 to 28, are advantageous in the following respects.

A side wall made of one material is formed on the gate electrode of each memory cell. Similarly, a side wall made of one material is formed on the gate electrode of each low voltage transistor. By contrast, a side wall composed of two materials is formed on the sides of the gate electrode of each high-voltage transistor. More specifically, the sides of the gate electrode of each memory cell is covered with a first side-wall film having, for example, an etching rate lower than the pre-metal dielectric does. And, so are the sides of the gate electrode of each low voltage transistor. On the other hand, The sides of the gate electrode of each high-voltage transistor is covered with a first side-wall film of the same type and a second side-wall film having an etching rate substantially equal to that of the pre-metal dielectric. Further, the LDDs of each low voltage transistor are provided right below the side wall made of the first side-wall film, whereas the LDDs of each high-voltage transistor are formed right below the side wall made of the first and second side-wall films.

Hence, in each memory cell, the margin H4 between the gate electrode and the contact hole can be decreased. This helps increase the storage capacity of the NOR-type flash EEPROM or reduce the size of the EEPROM chip. In each low voltage transistor, the margin H4' between the gate electrode and the contact hole is decreased, thereby making the low voltage transistor smaller and reducing the LDD length thereof. The on-resistance of the low voltage transistor is thereby lowered. (That is, the current-driven efficiency is enhanced.)

In each high-voltage transistor, the margin H2 between the gate electrode and the contact hole is sufficiently large. Further, diffusion layers functioning as LDDs are provided right below the first and second side-wall films. The LDDs are long and deep, rendering the drain breakdown voltage adequately high.

Figure 29:
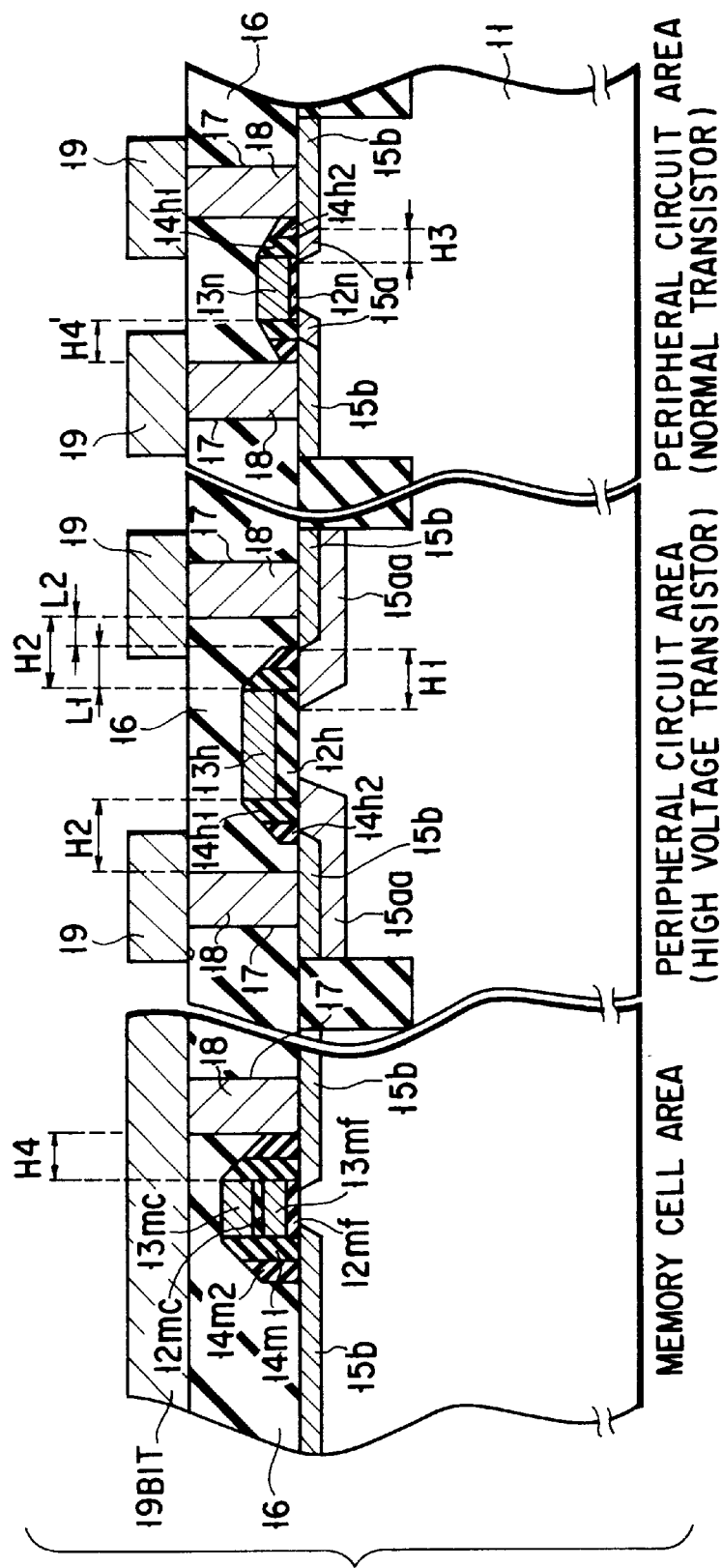
FIG. 29 is a sectional view illustrating MISFETs according to the present invention, which are incorporated in a NOR-type flash EEPROM.

FIG. 29 shows MISFETs according to the invention, which are incorporated in a NOR-type flash EEPROM.

These MISFETs differ from those shown in FIG. 21 in that they have side walls that are substantially identical in structure. In other words, the memory cells, low voltage transistors and high-voltage transistors incorporated in this NOR-type flash EEPROM have side walls of substantially the same structure.

The NOR-type flash EEPROM will be described below in detail.

The memory cells arranged in the memory cell area will be explained first.

Each memory cell has stacked gate structure. As shown in FIG. 29, a gate insulating film 12$mf$ is formed on a semiconductor substrate 11. A floating gate electrode 13$mf$ is formed on the gate insulating film 12$mf$. An insulating film 12$mc$ is formed on the floating gate electrode 12$mf$. A control gate electrode 13$mc$ is provided on the insulating film 12$mc$. Two insulating films 14$m$1 and 14$m$2 are formed on the sides of the floating gate electrode 13$mf$ and control gate electrode 13$mc$, forming an insulating film called "side wall."

The side-wall film 14$m$1 contacts the floating gate electrode 13$mf$ and control gate electrode 13$mc$ and has a thickness L1 of, for example, about 100 nm. The side-wall film 14$m$2 is provided on the side-wall film 14$m$1 and has a thickness L2 of, for example, about 100 nm. The films 14$m$1 and 14$m$2 are made of different materials. For instance, the side-wall film 14$m$1 is made of silicon nitride film, whereas the side-wall film 14$m$2 is made of silicon oxide film.

As far as the memory cell is concerned, the side-wall films 14$m$1 and 14$m$2 are unnecessary. Nevertheless, they are provided on the sides of the floating gate electrode 13$mf$ and control gate electrode 13$mc$, in order to facilitate or simplify the processing of the wafer, more precisely to reduce the number of times EPE is performed. The side wall composed of the side-wall films 14$m$1 and 14$m$2 has the same structure as the side wall provided on the sides of the gate electrodes of any transistor provided in the peripheral circuit area. The peripheral circuit area will be described later.

The memory cells of the NOR-type flash EEPROM shown in FIG. 29 are of so-called "channel-erasing type." In each memory cell, electrons are moved from the floating gate into the substrate 11 (i.e., channel) to erase data. This is why two diffusion layers 15$b$ are formed in the substrate 11, for each memory cell, and used as the source and drain of the memory cell. On the semiconductor substrate 11, a pre-metal dielectric 16 is formed, completely covering the memory cells of stacked structure. The pre-metal dielectric 16 has a contact hole 17 that reaches one of the diffusion layers 15$b$, which is the drain. A contact plug 18 made of, for example, tungsten (W), is formed in the contact hole 17. A metal wire 19 is provided on the contact plug 18.

A margin H4 is provided between the gate electrodes 13$mf$ and 13$mc$, on the one hand, and the contact hole 17, on the other. This margin H4 is strictly determined in consideration of desired size reduction of the memory cell and the alignment error that may occur in the course of PEP performed on the wafer. The margin (width) H4 is set at, for example, about 0.4 $\mu$m.

In each memory cell, the contact hole 17 may be closer to the gate electrodes 13$mf$ and 13$mc$ than designed due to an alignment error made during the PEP. Even if this happens, the bottom area of the hole 17 will not become smaller than that of the side-wall film 14$m$2, because the film 14$m$2 is made of silicon oxide film (i.e., the same material as the pre-metal dielectric 16). Hence, it is possible to prevent an increase in the contact resistance, despite the alignment error made during the PEP.

Furthermore, even if the hole 17 is located closer to the gate electrodes 13$mf$ and 13$mc$ than designed due to an alignment error, the contact plug 18 will not short-circuited with the gate electrode 13$mf$ or 13$mc$. This is because the side-wall film 14$m$1 is made of silicon nitride film (i.e., a material different from that of the pre-metal dielectric 16).

As mentioned above, the margin H4 is relatively small in each memory cell. This serves to increase the storage capacity of the NOR-type flash EEPROM or to reduce the size of the EEPROM chip. Although the margin H4 is small, the contact resistance does not increase. Nor is the contact plug 18 short-circuit with the with the gate electrode 13$mf$ or 13$mc$.

The high-voltage transistors provided in the peripheral circuit area will be described.

The high-voltage transistors operate at a voltage higher than the power-supply voltage VCC (3.3V, 5V or the like), which ranges, for example, from 6V to 20V.

Gate insulating films 12$h$ are provided on the semiconductor substrate 11. Gate electrodes 13$h$ are provided on the gate insulating films 12$h$. The gate insulating films 12$h$ are, for example, about 20 nm thick, or thick enough not to undergo dielectric breakdown when applied with the high voltage. An insulating film called "side wall" is provided on the sides of the gate insulating film 12$h$ and gate electrode 13$h$ of each high-voltage transistor. The side wall consists of side-wall films 14$h$1 and 14$h$2.

The side-wall film 14$h$1 has a thickness of, for example, about 100 nm. The side-wall film 14$h$2 has a thickness of, for example, about 100 nm, too. Therefore, the total thickness L1 of the films 14$h$1 and 14$h$2 is about 200 nm. In other words, the side wall has a thickness (width) L1 of bout 200 nm. The NOR-type flash EEPROM of FIG. 29 is characterized in that the side wall composed of two films 14$h$1 and 14$h$2 of different materials is formed on the sides of gate electrode 13$h$ of each high-voltage transistor. The inner side-wall film 14$h$1, which contacts the sides of gate electrode 13$h$, is made of the same material and has the same thickness, as the side wall 14$m$ of the memory cell and the side wall 14$n$1 of the low voltage transistor. The outer side-wall film 14$h$2, which contacts the side-wall film 14$h$1, is made of the same material and has the same thickness as the side-wall film 14$m$2 of the memory cell and the side-wall film 14$n$2 of the low voltage transistor.

Diffusion layers 15aa having low impurity concentration, called "LDDs (Lightly Doped Drains)," are formed in the surface of the semiconductor substrate 11. And diffusion layers 15b (sources and drains) are formed in the diffusion layers 15aa, respectively. The diffusion layers 15b have a higher impurity concentration than the diffusion layers 15aa.

The diffusion layers 15aa are deep so that the breakdown voltage at the p-n junction of each high-voltage transistor may be higher than the operating voltage of the high-voltage transistor. Only diffusion layers 15aa are formed in those parts of the substrate 11, which lie right below the side-wall films 14h1 and 14h2. The diffusion layers 15aa have a length H1 that is proportional to the total thickness L1 of the side-wall films 14h1 and 14h2. The thickness H1 is sufficiently large (e.g., about 0.2 $\mu$m) so that the breakdown voltage at the p-n junction of each high-voltage transistor may be higher than the operating voltage of the high-voltage transistor.

The thickness of the diffusion layers 15aa and the total thickness L1 of the side-wall films 14h1 and 14h2 influence the width of the depletion layer that develops in the p-n junction area of each high-voltage transistor. The greater the thickness of the layers 15aa and the total thickness L1, the broader the depletion layer and, hence, the higher the breakdown voltage of the high-voltage transistor.

A pre-metal dielectric 16 is formed on the semiconductor substrate 11. The insulator 16 completely covers the MISFETS. The pre-metal dielectric 16 has contact holes 17, each reaching a diffusion layer 15b. Contact plugs 18 made of, for example, tungsten (W), are formed in the contact holes 17. Metal wires 19 are provided on the contact plugs 18, respectively.

In each high-voltage transistor, the contact hole 17 is positioned, not overlapping the side-wall film 14h1 or the side-wall film 14h2. The margin (width) H2 between the gate electrode 13h and the contact hole 17 is the sum of the thickness L1 (i.e., the total thickness of the films 14h1 and 14h2) and the margin L2 between the films 14h1 and 14h2, on the one hand, and the contact hole 17, on the other. The margin L2 is determined from the accuracy of aligning a mask in the photo engraving process (PEP) and the dimensional precision of the contact hole 17.

As described above, the total thickness L1 of the side-wall films 14h1 and 14h2 is, for example, about 0.2 $\mu$m. (The thickness L1 is also 0.2 $\mu$m in the conventional EEPROM shown in FIG. 7.) Thus, the margin (width) H2 between the gate electrode 13h and the adjacent contact hole 17 will be 0.4 $\mu$m if the margin L2 between the films 14h1 and 14h2, on the one hand, and the contact hole 17, on the other, is 0.2 $\mu$m. (The margin H2 is also 0.4 $\mu$m in the conventional EEPROM shown in FIG. 7.)

Thus, the high-voltage transistors according to this invention can have its p-n junction breakdown voltage increased due to the long LDD length and the deep diffusion layers of low impurity concentration, in the same way as the conventional high-voltage transistors.

The low voltage transistors provided in the peripheral circuit area will now be described.

The low voltage transistors are ones which operate at the power-supply voltage VCC (3.3V or 5V) or at a voltage lower than the power-supply voltage VCC.

As shown in FIG. 29, gate insulating films 12n are provided on the semiconductor substrate 11. Gate electrodes 13n are provided on the gate insulating films 12h. An insulating film called "side wall" is provided on the sides of each gate electrode 13n. The side wall consists of two side-wall films 14n1 and 14n2. Diffusion layers 15a having low impurity concentration, called "LDDs (Lightly Doped Drains)," are formed in the surface of the semiconductor substrate 11, two located right below one side-wall film 14n1. No diffusion layers are provided below the side-wall film 14n2.

Adjacent to the respective diffusion layers 15a, diffusion layers 15b (sources and drains) are provided. The diffusion layers 15b have an impurity concentration higher than the diffusion layers 15a. A pre-metal dielectric 16 is formed on the semiconductor substrate 11, also in the peripheral circuit area. The insulator 16 completely covers the MISFETS. The pre-metal dielectric 16 has contact holes 17, each reaching one of the diffusion layers 15b of each low voltage transistor. Contact plugs 18 made of, for example, tungsten (W), are formed in the contact holes 17. Metal wires 19 are provided on the contact plugs 18.

In each low voltage transistor, a margin H4' is provided between the gate electrode 13n and the contact hole 17. This margin H4 is strictly determined in consideration of desired size reduction of the memory cell and the alignment error that may occur in the course of PEP performed on the wafer. The margin (width) H4' is set at, for example, about 0.4 $\mu$m.

The contact hole 17 may be closer to the gate electrodes 13n than designed due to an alignment error made during the PEP. Even if this happens, the bottom area of the hole 17 will not become smaller than that of the side-wall film 14n2, because the film 14n2 is made of silicon oxide film (i.e., the same material as the pre-metal dielectric 16). Hence, it is possible to prevent an increase in the contact resistance, despite the alignment error made during the PEP.

Moreover, even if the hole 17 is located closer to the gate electrodes 13n than designed due to an alignment error, the contact plug 18 will not short-circuited with the gate electrode 13n. This is because the side-wall film 14n1 is made of silicon nitride film (i.e., a material different from that of the pre-metal dielectric 16).

As indicated above, the margin H4' is relatively small in each low voltage transistor. This serves to increase the storage capacity of the NOR-type flash EEPROM or to reduce the size of the EEPROM chip. Although the margin H4' is small, the contact resistance does not increase. Nor is the contact plug 18 short-circuit with the with the gate electrode 13n.

The method of manufacturing the flash EEPROM depicted in FIG. 29 will now be explained.

Figure 30:
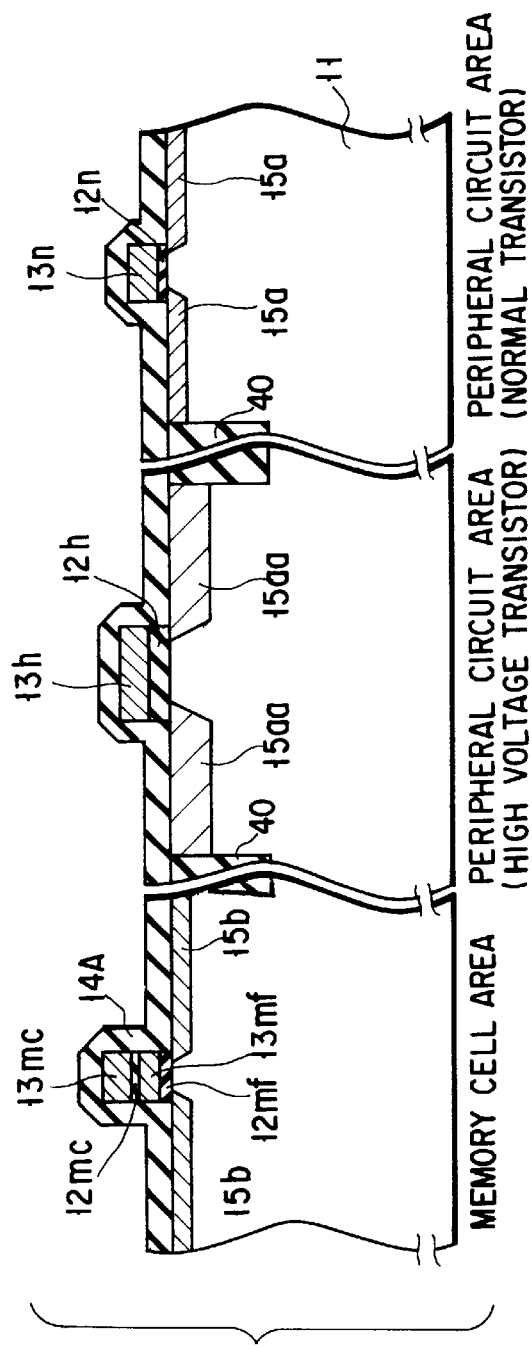

First, as shown in FIG. 30, an element-isolating insulating film 40 having STI (Shallow Trench Isolation) structure is formed in the surface of the silicon substrate 11 (or a well region). More precisely, trenches are cut in the surface of the silicon substrate 11, an insulating film is formed in the trenches and on the surface of the substrate 11, and CMP (Chemical Mechanical Polishing) is carried out. The parts of the insulating film, other than those formed in the trenches, are thereby removed.

Then, gate oxide films 12n and gate insulating films 12h, respectively for low voltage transistors and high-voltage transistors, are formed in the peripheral circuit area. In the memory cell area, gate insulating films 12mf are formed for memory cells. The gate insulating films 12h for the high-voltage transistors are thinner than the gate insulating films 12n for the low voltage transistors and the gate insulating films 12mf for the memory cells.

In the peripheral circuit area, gate electrodes 13n are formed on the gate insulating films 12n for the low voltage transistors, and gate electrodes 13h are formed on the gate insulating films 12h for the high-voltage transistors. In the memory cell area, floating gate electrodes 13mf are formed on the gate insulating films 12mf for the memory cells, insulating films 12mc (e.g., ONO (Oxide/Nitride/Oxide) films) are formed on the floating gate electrodes 13mf, and control gate electrodes 13mc are formed on the insulating films 12mc.

The gate electrodes 13n and 13h, floating gate electrodes 13mf and control gate electrodes 13mc are formed by known techniques. The gate electrodes 13n and 13h may be formed by, for example, CVD (Chemical Vapor Deposition), PEP (Photo Engraving Process) and RIE (Reactive Ion Etching) in the peripheral circuit area. The floating gate electrodes 13mf and control gate electrodes 13mc may be formed by, for example, CVD, PEP and RIE in the memory cell area.

Next, thermal oxidation is performed, forming a thin oxide film (not shown) on the surfaces of the semiconductor substrate 11, gate electrodes 13n and 13h, floating gate electrodes 13mf and control gate electrodes 13mc. Thereafter, ion implantation is carried out.

As for the low voltage transistors in the peripheral circuit area (e.g., N-channel MISFETs that operate at 2.5V and constitute a CMOS circuit), phosphorus (P) ions and arsenic (As) ions are implanted into the substrate 11, by means of self-alignment contact technique using the gate electrodes 13n as a mask. The dose of arsenic is, for example, $1 \times 10^{14}$ $cm^{-2}$ or more. The dose of phosphorus is smaller, about ten times as less than the dose of arsenic. These impurities will be activated, forming diffusion layers (LDDs) 15a, when annealing is performed later.

As for the high-voltage transistors in the peripheral circuit (e.g., N-channel MISFETs that have a drain breakdown voltage of 10V or more and constitute a circuit for driving the memory cells), phosphorus (P) are ion-implanted to the substrate 11. This ion implantation is effected by means of self-alignment contact technique using the gate electrodes 13h as a mask. The dose of phosphorus is smaller than that applied to form the low voltage transistors, for example about $5 \times 10^{13}$ $cm^{-2}$. This impurity will be activated, forming diffusion layers (LDDS) 15aa, when annealing is performed later.

The diffusion layers 15aa contain the phosphorus that has been ion-implanted into the substrate 11. Therefore, the diffusion layers 15aa are deeper than the diffusion layers 15a of each low voltage transistor. The diffusion layers 15aa have a lower impurity concentration than the diffusion layers 15a. Hence, the diffusion layers 15aa serve to broaden the depletion layer that has developed in the p-n junction of each high-voltage transistor and in the vicinity of the p-n junction. This helps increase the breakdown voltage of the source/drain diffusion layers of the high-voltage transistor.

As for the memory cells in the memory cell area (e.g., memory cells of a NOR-type flash EEPROM), ion implantation is carried out to form the source/drain diffusion layers. For example, arsenic and phosphorus are ion-implanted into the substrate 11 to form the source/drain diffusion layers 15b in the memory cell area, by using the control gate electrodes 13mc and floating gate electrodes 13mf as a mask. These impurities will be activated, forming source/drain diffusion layers 15b.

Then, as shown in FIG. 23, LPCVD (Low-Pressure Chemical Vapor Deposition) is effected, forming a silicon nitride film 14A on the entire surface of the semiconductor substrate 11. Made of silicon nitride, the film 14A has a lower etching rate than the interlayer does insulator (later described). The silicon nitride film 14A has a thickness T1 (e.g., about 100 nm).

Figure 31:
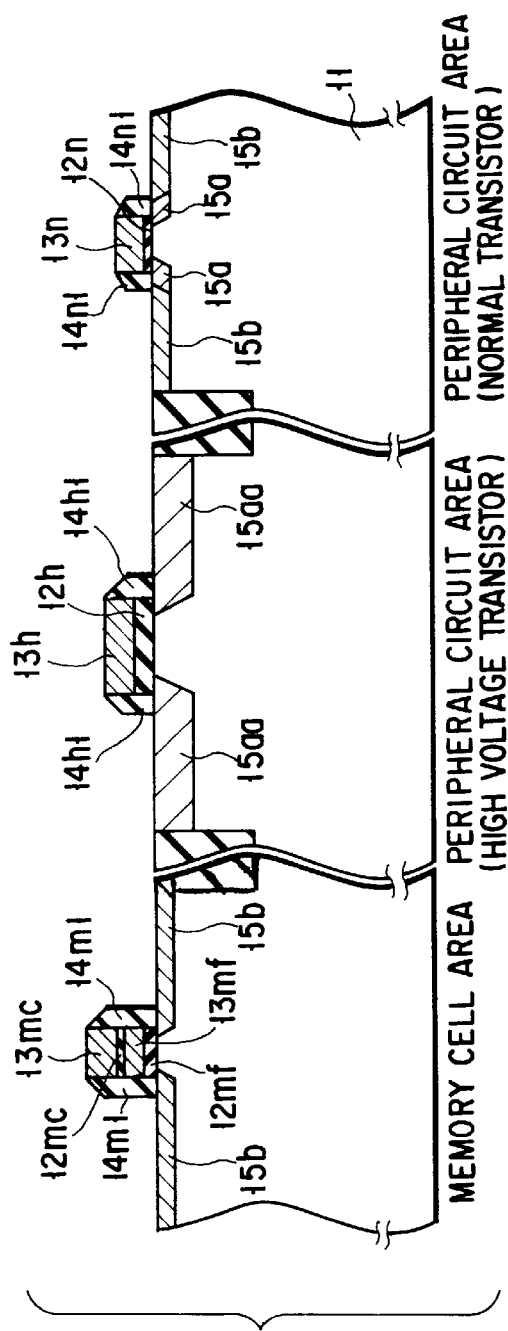

Next, as shown in FIG. 31, the silicon nitride film 14A is subjected to RIE, thereby forming a side-wall film 14m1 is formed on the sides of the gate electrodes 13mf and 13mc of each memory cell. At the same time, a side-wall film 14l is formed on the sides of the gate electrode 13h of each high-voltage transistor, and a side-wall film 14n1 is formed on the sides of the gate electrode 13n of each low voltage transistor.

Thereafter, PEP is performed, forming a photoresist film. The photoresist film covers the memory cell area and also the areas in which high-voltage transistors will be formed in the peripheral circuit area. Then, arsenic, for example, is ion-implanted into those areas of the substrate 11 in which low voltage transistors will be formed in the peripheral circuit area. This ion implantation is effected by means of self-alignment technique using the photoresist film and the gate electrodes 13n as a mask. The dose of arsenic is about $5 \times 10^{15}$ $cm^{-2}$.

The impurities (arsenic) implanted into the semiconductor substrate 11 will be activated later by thermal process, forming diffusion layers (source/drain diffusion layers) 15b.

Figure 32:
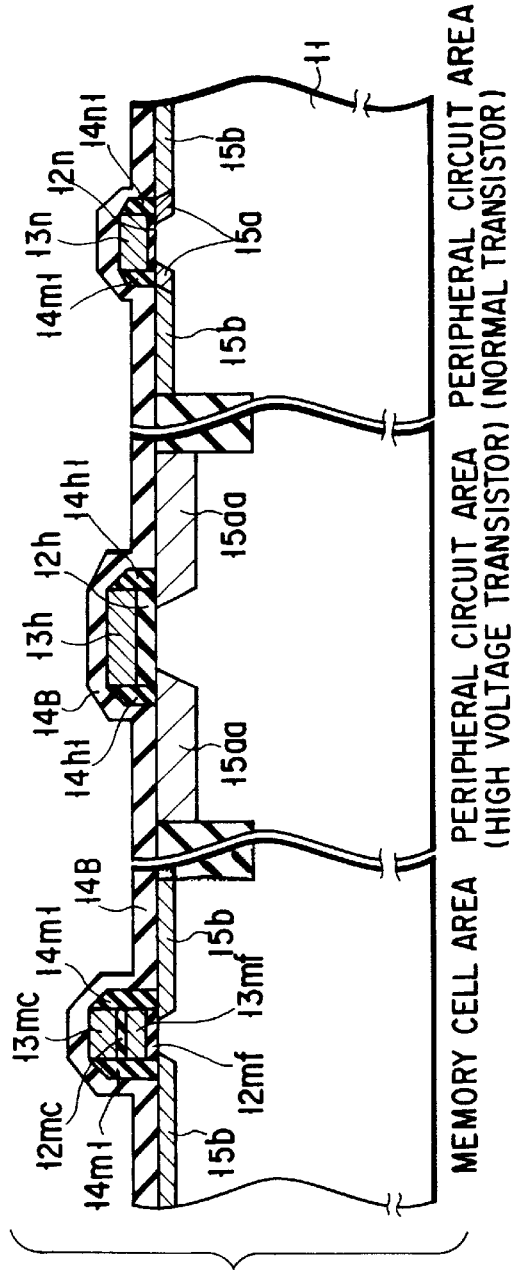

Then, as shown in FIG. 32, LPCVD is performed, forming a silicon oxide film 14B on the semiconductor substrate 11, covering the gate electrodes 13mf, 13mc, 13h and 13n. The silicon oxide film 14B has a thickness T2 (e.g., about 100 nm). (The film 14B is made of material that has substantially the same etching rate as the pre-metal dielectric.)

Figure 33:
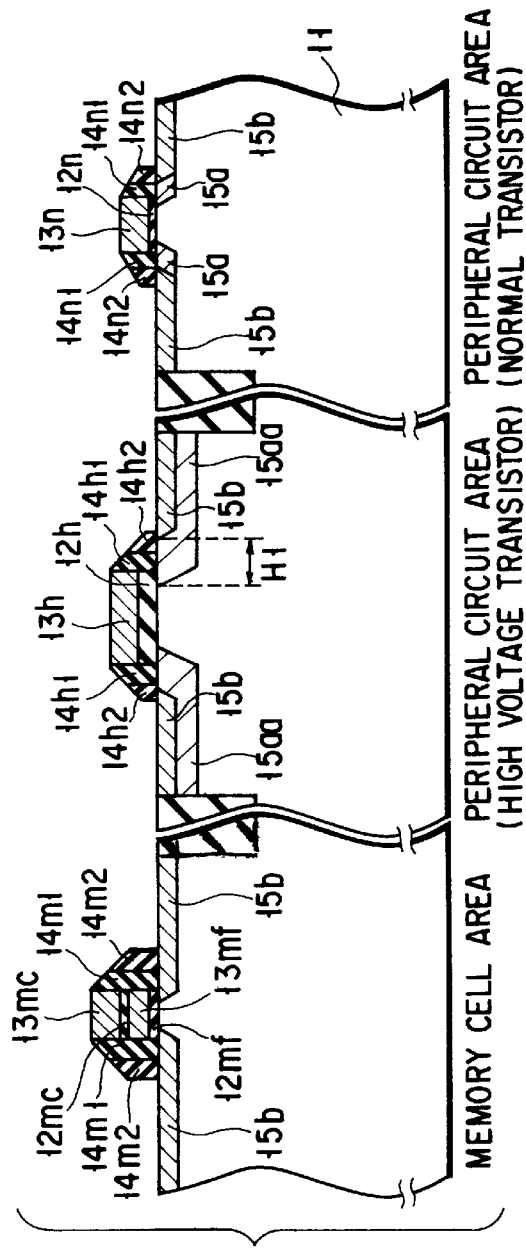

Next, RIE is then performed, etching the silicon oxide film 14B as shown in FIG. 33. As a result, a side-wall film 14m2 is formed on the sides of the side-wall film 14m1 of each memory cell, a side-wall film 14h2 is formed on the sides of the side-wall film 14h1 of each high-voltage transistor, and a side-wall film 14n2 is formed on the sides of the side-wall film 14n1 of each low voltage transistor.

Further, PEP is performed, forming a photoresist film. The photoresist film covers the memory cell area and also the areas in which low voltage transistors will be formed in the peripheral circuit area. Then, arsenic, for example, is ion-implanted into those areas of the substrate 11 in which low voltage transistors will be formed in the peripheral circuit area. This ion implantation is effected by means of self-alignment technique using the photoresist film and the gate electrodes 13n as a mask. The dose of arsenic is about $5 \times 10^{15}$ $cm^{-2}$.

The impurities (arsenic) implanted into the semiconductor substrate 11 will be activated later by thermal process, forming diffusion layers (source/drain diffusion layers) 15b.

In the NOR-type flash EEPROM of FIG. 29, the memory cells, low voltage transistors and high-voltage transistors have side walls of the same structure. The memory cells have no LDDs, whereas the high-voltage transistors and low voltage transistors have LDDs. The LDD length of the high-voltage transistors (substantially equal to the total thickness of the side-wall films 14h1 and 14h2) is greater than the LDD length of the low voltage transistors (substantially equal to the thickness of the side-wall film 14n1).

Hence, the low voltage transistors provided in the peripheral circuit area have an LDD length that is substantially equal to the thickness T1 (e.g., 100 nm) of the side-wall film 14n1 and have their parasitic resistance decreased. The low voltage transistors are, therefore, high-performance MISFETs. The high-voltage transistors provided in the peripheral circuit area, too, have an LDD length that is substantially equal to the total thickness T1=L+T2 (e.g., 200 nm) of the side-wall films 14h1 and 14h2, and their source/drain diffusion layers have a high breakdown voltage. The high-voltage transistors are also high-performance MISFETS.

Next, as shown in FIG. 34, LPCVD is performed, forming a pre-metal dielectric 16 on the entire surface of the semiconductor substrate 11. The pre-metal dielectric 16 covers the memory cells and the MISFETs. The insulator 16 is, for example, a silicon oxide film (BPSG film) which contains boron and phosphorus. Then, a process, such as CMP (Chemical Mechanical Polishing), is carried out, rendering the surface of the pre-metal dielectric 16 flat.

Further, PEP is effected, forming a resist pattern on the pre-metal dielectric 16. The resist pattern consists of two contact-hole patterns. The first contact-hole pattern is designed to make contact holes that will reach the drain diffusion layers of the memory cells. The second contact-hole pattern is designed to make contact holes that will reach the diffusion layers of the MISFETs formed in the peripheral circuit area.

In each normal, a margin H4' is provided between the gate electrode 13n and the corresponding opening in the resist pattern (i.e., contact hole). In each high-voltage transistor, a margin H2 is provided between the gate electrode 13h and the corresponding opening in the resist pattern (i.e., contact hole). In each memory cell, a margin H4 is provided between the gate electrodes 13mf and 13mc, on the one hand, and the opening of the resist pattern (i.e., the contact hole), on the other.

Using the resist pattern as a mask, RIE is effected, thereby etching the pre-metal dielectric 16. Contact holes 17 are thereby made in the pre-metal dielectric 16. Then, the resist pattern is removed.

Next, contact plugs 18 made of, for example, tungsten are formed in the contact holes 17. To be more specific, CVD and CMP are carried out, forming the contact plugs 18 in the contact holes 17 only. Metal wires 19 are formed on the contact plugs 18, respectively.

The semiconductor device and the method of manufacturing the same, which have been described with reference to FIGS. 29 to 34, are advantageous in the following respects.

A side wall composed of two materials is formed on the sides of the gate electrodes of each memory cell, on the sides of the gate electrode of each high-voltage transistor, and on the sides of the gate electrode of each low voltage transistor. More specifically, sides of the gate electrode of each memory cell, the sides of the gate electrode of each high-voltage transistor and the sides of the gate electrode of each low voltage transistor are covered with a first side-wall film having an etching rate lower than that of the pre-metal dielectric and a second side-wall film having an etching rate substantially equal to that of the pre-metal dielectric. Further, the LDDs of each low voltage transistor are provided right below only the first side-wall film, whereas the LDDs of each high-voltage transistor are formed right below both the first and second side-wall films.

Hence, in each memory cell, the margin H4 between the gate electrode and the contact hole can be decreased. This helps increase the storage capacity of the NOR-type flash EEPROM or reduce the size of the EEPROM chip. In each low voltage transistor, the margin H4' between the gate electrode and the contact hole is decreased, thereby making the low voltage transistor smaller and reducing the LDD length thereof. The on-resistance of the low voltage transistor is thereby lowered. (That is, the current-driven efficiency is enhanced.)

In each high-voltage transistor, the margin H2 between the gate electrode and the contact hole is sufficiently large. Further, diffusion layers functioning as LDDs are provided right below the first and second side-wall films. The LDDs are long and deep, rendering the drain breakdown voltage adequately high.

FIG. 35 shows MISFETs according to the invention, which function as memory cells in a NOR-type flash EEPROM.

The memory cells have stacked gate structure. In each memory cell, a gate insulating film 12mf is formed on the semiconductor substrate 11. A floating gate electrode 13mf is provided on the gate insulating film 12mf. An insulating film 12mc is formed on the floating gate electrode 12mf. A control gate electrode 13mc is provided on the insulating film 12mc. An insulating film 14m1, called "side-wall film," is formed on the sides of the floating gate electrode 13mf and control gate electrode 13mc.

The side-wall film 14m1 contacts the floating gate electrode 13mf and control gate electrode 13mc and has a thickness L1 of, for example, about 100 nm. Another side-wall film 14m2 is provided on only that side of the side-wall film 14m1 below which the drain of the memory cell is formed. The film 14m2 has a thickness L2 of, for example, about 100 nm. The films 14m1 and 14m2 are made of different materials. For instance, the side-wall film 14m1 is made of silicon nitride film, whereas the side-wall film 14m2 is made of silicon oxide film.

The memory cells shown in FIG. 35 are of so-called "channel-erasing type." In each memory cell, electrons are moved from the floating gate 13mf into the substrate 11 (i.e., channel) to erase data. Thus, a source diffusion layer 15b-SOURCE and a drain diffusion layer 115b-DRAIN are formed in the substrate 11, for each memory cell. On the semiconductor substrate 11, a pre-metal dielectric 16 is formed, completely covering all memory cells of stacked structure. The pre-metal dielectric 16 has contact holes 17, each reaching the drain diffusion layer 15b-DRAIN of one memory cell. Contact plugs 18 made of, for example, tungsten (W), are formed in the contact holes 17. Metal wires 19 bit (bit lines) are provided on the contact plugs 18, respectively.

Each source diffusion layer 15b-SOURCE is shared by two adjacent memory cells. This is because the flash EEPROM is a NOR-type one. Each source diffusion layer 15b-SOURCE is covered with the side-wall films 14m1 of the two adjacent memory cells. The side-wall films 14m1 of the two adjacent memory cells completely fill the space between the gate electrodes of the two memory cells, which is located on the source diffusion layer 15b-SOURCE.

The gap W2 between the gate electrodes of two adjacent memory cells, which are located on each drain diffusion layer 15b-DRAIN, is broader than th e gap W1 between the gate electrodes of two adjacent memory cells, which are located on each source diffusion layer 15b-SOURCE. For instance, the gap W2 is twice as broad as the gap W1. This is because the pre-metal dielectric 16 needs to have contact holes 17, each of which reaches the drain diffusion layer 15b-DRAIN.

In practice it is desired that the gap W2 be greater than the sum of the diameter of the contact hole 17 and twice the thickness of each side-wall film 14m1. This serves the purpose of imparting a sufficient bottom area to the contact hole 17, thereby to suppress an increase of contact resistance.

FIG. 36 shows MISFETs according to this invention, constituting a memory cell unit of a NAND-type flash EEPROM.

The memory cell unit comprises a NAND string of memory cells MC (e.g., $2^n$ memory cells, where n is a natural number), two select transistors ST1 connected to one end of the NAND string, and two select transistors ST2 connected to the other end of the NAND string.

The memory cells MC have stacked gate structure. In each memory cell MC, a gate insulating film 12*mf* is formed on the semiconductor substrate 11. A floating gate electrode 13*mf* is provided on the gate insulating film 12*mf*. An insulating film 12*mc* is formed on the floating gate electrode 12*mf*. A control gate electrode 13*mc* is provided on the insulating film 12*mc*. An insulating film 14*m*1, called "side-wall film," is formed on the sides of the floating gate electrode 13*mf* and control gate electrode 13*mc*, forming an insulating film called "side wall."

The side-wall film 14*m*1 contacts the floating gate electrode 13*mf* and control gate electrode 13*mc* and has a thickness L1 of, for example, about 100 nm. The film 14*m*1 is made of, for example, silicon nitride.

In the NAND string, any two adjacent memory cells MC share one diffusion layer 15*b*. The diffusion layer 15*b* is covered with the side-wall films 14*m*1 of the two adjacent memory cells MC. The side-wall film 14*m*1 completely fills the gap between the memory cells MC, which is located on the diffusion layer 15*b*. The gap W1 between the memory cells MC is substantially equal to twice the thickness of each side-wall film 14*m*1.

The select transistors ST1 provided on the drain side (i.e., bit-line side) have stacked structure, like the memory cells MC. only the lower gate electrode, for example, of each transistor ST1 functions as a gate electrode. In each select transistor ST1, two insulating films 14*m*1 and 14*m*2 are formed on the sides of both gate electrodes of the select transistor ST1, forming an insulating film called "side wall."

The side-wall film 14*m*1 contacts the sides of the gate electrodes and has a thickness L1 of, for example, 100 nm. The side-wall film 14*m*2 is provided on only that side of the side-wall film 14*m*1 below which a drain diffusion layer 15*b*-DRAIN is formed. The film 14*m*2 has a thickness L2 of, for example, about 100 nm. For instance, the side-wall film 14*m*1 is made of silicon nitride film, whereas the side-wall film 14*m*2 is made of silicon oxide film.

The gap W2 between the gate electrodes of the select transistors ST1, which are provided on one drain diffusion layer 15*b*-DRAIN, is broader than the gap W1 between the gate electrodes of two adjacent memory cells MC, which are located on one diffusion layer. For instance, the gap W2 is twice or more as broad as the side-wall film 14*m*1 is thick. This is because the pre-metal dielectric 16 needs to have contact holes 17, each of which reaches the drain diffusion layer 15*b*-DRAIN.

In practice it is desired that the gap W2 be greater than the sum of the diameter of the contact hole 17 and twice the thickness of each side-wall film 14*m*1. This serves the purpose of imparting a sufficient bottom area to the contact hole 17, thereby to suppress an increase of contact resistance.

The select transistors ST2 provided on the source side (i.e., source-line side) have stacked structure, like the memory cells MC. Only the lower gate electrode, for example, of each transistor ST2 functions as a gate electrode. In each select transistor ST2, two insulating films 14*m*1 and 14*m*2 are formed on the sides of both gate electrodes of the select transistor ST2, forming an insulating film called "side wall."

The side-wall film 14*m*1 contacts the sides of the gate electrodes and has a thickness L1 of, for example, 100 nm. The side-wall film 14*m*2 is provided on only that side of the side-wall film 14*m*1 below which a source diffusion layer 15*b*-SOURCE is formed. The film 14*m*2 has a thickness L2 of, for example, about 100 nm. For instance, the side-wall film 14*m*1 is made of silicon nitride film, whereas the side-wall film 14*m*2 is made of silicon oxide film.

The gap W3 between the gate electrodes of the select transistors ST2, which are provided on one source diffusion layer 15*b*-SOURCE, is as broad as or broader than the gap W1 between the gate electrodes of two adjacent memory cells MC, which are located on one diffusion layer 15*b*. For example, the gap W3 is twice or more as the total thickness of at least the side-wall films 14*m*1 and 14*m*2.

In the structure shown in FIG. 36, no contact holes 17 are made in the pre-metal dielectric 16, for the source diffusion layers 15*b*-SOURCE. Nonetheless, contact holes may be made in the insulator 16, for source diffusion layers 15*b*-SOURCE, as well as drain diffusion layers 15*b*-DRAIN. In this case, source lines SL are provided on the source diffusion layers 15*b*-SOURCE.

The pre-metal dielectric 16 is provided in the semiconductor substrate 11, completely covering the memory cells MC of stacked structure. Contact plugs 18 made of, for example, tungsten (W), are formed in the contact holes 17 made in the pre-metal dielectric 16. Metal wires 19 bit (bit lines) are provided on the contact plugs 18.

As can be understood from the devices shown in FIGS. 35 and 36, the MISFETs according to the present invention can be used as memory cells of nonvolatile memories such as NOR-type flash EEPROM and NAND-type flash EEPROM. Further, the MISTFETs of this invention can be used as memory cells of dynamic RAMs. Still further, the MISFETs of the present invention can be incorporated in all kinds of semiconductor integrated circuits.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first transistor on a semiconductor substrate having a gate electrode and a diffusion layer, transferring a first operating voltage;
   a second transistor on the semiconductor substrate having a gate electrode and a diffusion layer, transferring a second operating voltage for driving a memory cell higher than the first operating voltage;
   a dielectric film having a first contact hole reaching the diffusion layer of the first transistor and a second contact hole reaching the diffusion layer of the second transistor, said dielectric film covering the first and second transistors;
   first side-wall films provided on sides of the gate electrodes of the first and second transistors; and
   second side-wall films provided on sides of the first side-wall films of the second transistor and different in material from the first side-wall films, an etching rate for opening the contact holes of the first side-wall films being lower than an etching rate of the second side-walls;
   wherein the diffusion layer of the second transistor has a Lightly-Doped-Drain structure, and a width defined between an edge of the gate of the second transistor and the second contact hole being greater than a width defined between an edge of the gate of the first transistor and the first contact hole.

2. A semiconductor device according to claim 1, wherein the diffusion layer of the second transistor comprises a Lightly-Doped-Drain layer and a drain layer having an impurity concentration higher than that of the Lightly-Doped-Drain layer and contacting the Lightly-Doped-Drain layer, the Lightly-Doped-Drain layer being provided in a part of the semiconductor substrate which lies below the first and second side-wall films, and the drain layer being provided in a part of the semiconductor substrate which has been introduced from outside of the second side-wall films in a self-alignment manner.

3. A semiconductor device according to claim 1, wherein the first side-wall films are silicon nitride films and the second side-wall films are silicon oxide films.

4. A semiconductor device according to claim 1, wherein the second side-wall films are silicon oxide films including phosphorus ions.

5. A semiconductor device according to claim 1, wherein the first contact hole overlaps the first side-wall films of the first transistor.

6. A semiconductor device according to claim 1, further comprising cap insulating films provided on the gate electrodes of the first and second transistors, and having an etching rate substantially equal to that of the first side-wall films of the first and second transistors.

7. A semiconductor device according to claim 6, wherein the cap insulating films and the first side-wall films are silicon nitride films.

8. A semiconductor device according to claim 1, wherein the memory cell is a non-volatile memory cell having a floating gate electrode and a control gate electrode on the semiconductor substrate and having a diffusion layer in the semiconductor substrate.

9. A semiconductor device according to claim 8, further comprising third side-wall films provided on sides of the control gate electrode and fourth side-wall films provided on sides of the third side-wall films and different in material from that of the third side-wall films.

10. A semiconductor device according to claim 9, wherein the dielectric film has a third contact hole reaching the diffusion layer of the non-volatile memory cell, a width defined between the control gate electrode and the third contact hole is less than that defined between the gate electrode of the second transistor and the second contact hole.

11. A semiconductor device according to claim 10, wherein the third contact hole overlaps the third side-wall film.

12. A semiconductor device according to claim 9, further comprising a cap insulating film provided on the control gate electrode, and having an etching rate substantially equal to that of the third side-wall films.

13. A semiconductor device according to claim 12, wherein the cap insulating film and the third side-wall films are silicon nitride films.

14. A semiconductor device according to claim 1, further comprising:
first and second non-volatile memory cells, each having a floating gate electrode and a control gate electrode on the semiconductor substrate; and
a diffusion layer provided in a part of the semiconductor substrate which lies between the control gate electrodes of the first and second non-volatile memory cells, and having a width which is greater when the diffusion layer is a drain diffusion layer than when the diffusion layer is a source diffusion layer, in which case, the source diffusion layer covers a third side-wall film.

15. A semiconductor device according to claim 14, wherein the first and second non-volatile memory cells are memory cells of a NOR type flash memory.

16. A semiconductor device according to claim 1, further comprising:
non-volatile memory cells in series, each having a floating gate electrode and a control gate electrode on the semiconductor substrate;
diffusion layers provided in parts of the semiconductor substrate which lie between the control gate electrodes of the non-volatile memory cells;
third side-wall films provided on sides of the control gate electrodes of the non-volatile memory cells and completely covering the diffusion layers, and the third side-wall films and the first side-wall films are comprised of same materials; and
wherein the non-volatile memory cells are memory cells of a NAND type flash memory.

17. A semiconductor device according to claim 16, further comprising:
a select gate transistor having a select gate electrode and a diffusion layer, and connecting the non-volatile memory cells; and
fourth side-wall films provided on sides of the select gate electrode, the fourth side-wall films and the first side-wall films being comprised of same materials, wherein the dielectric film has a contact hole reaching the diffusion layer of the select gate transistor.

18. A semiconductor device according to claim 17, wherein the contact hole overlaps fourth side-wall films.

19. A semiconductor device comprising:
a first transistor on a semiconductor substrate having a gate electrode, transferring a first operating voltage;
a second transistor on the semiconductor substrate having a gate electrode, transferring a second operating voltage higher than the first operating voltage;
a dielectric film covering the first and second transistors;
a conductive film on the dielectric film; and
side-wall films on sides of the gate electrodes of the first and second transistors, wherein the second transistor has Lightly-Doped-Drain layers and drain layers in the semiconductor substrate, each of the Lightly-Doped-Drain layers having a first portion and a second portion, the first portion being located beneath the side-wall films, the second portion being in contact with the drain layers and beneath a region adjacent to the side-wall films distant from the gate electrode, and the drain layers being located distant from the side-wall films.

20. The semiconductor device according to claim 19, wherein the region adjacent to the side-wall films includes another side-wall film.

21. A semiconductor device comprising:
a first transistor on a semiconductor substrate having a gate electrode and a diffusion layer, transferring a first operating voltage;
a second transistor on the semiconductor substrate having a gate electrode and a diffusion layer, transferring a second operating voltage higher than that of the first operating voltage;
a dielectric film covering the first and second transistors;
a conductive film on the dielectric film;

side-wall films provided on sides of the gate electrodes of the first and second transistors, wherein a length of a contact portion of the semiconductor substrate and the side-wall films of the second transistor is greater than a length of a contact portion of the semiconductor substrate and the side-wall films of the first transistor; and the diffusion layer of the second transistor has a Lightly-Doped-Drain structure.

22. A semiconductor device according to claim 21, wherein the diffusion layer of the second transistor comprises a Lightly-Doped-Drain layer and a drain layer having an impurity concentration higher than that of the Lightly-Doped-Drain layer and contacting the Lightly-Doped-Drain layer, the Lightly-Doped-Drain layer being provided in a part of the semiconductor substrate which lies below the side-wall films, and the drain layer being provided in a part of the semiconductor substrate which has been introduced from outside of the side-wall films in a self-alignment manner.

23. A semiconductor device according to claim 21, wherein an etching rate of the side-wall film is lower than that of the dielectric film when a contact hole reaching the diffusion layer of the second transistor is formed in the dielectric film.

24. A semiconductor device according to claim 21, wherein the side-wall films are silicon nitride films and the dielectric film is silicon oxide film.

25. A semiconductor device according to claim 24, further comprising silicon oxide side-wall films located on sides of the side-wall films.

26. A semiconductor device according to claim 21, wherein the dielectric film has a first contact hole reaching the diffusion layer of the first transistor, a second contact hole reaching the diffusion layer of the second transistor and a width defined between the gate electrode of the second transistor and the second contact hole is greater than that defined between the gate electrode of the first transistor and the first contact hole.

27. A semiconductor device according to claim 26, wherein the first contact hole overlaps the side-wall film of the first transistor.

28. A semiconductor device according to claim 21, further comprising cap insulating films provided on the gate electrodes of the first and second transistors, and having an etching rate substantially equal to that of the side-wall films of the first and second transistors.

29. A semiconductor device according to claim 28, wherein the cap insulating films and the side-wall films are silicon nitride films.

30. A semiconductor device according to claim 26, further comprising a non-volatile memory cell having a floating gate electrode and a control gate electrode on the semiconductor substrate and having a diffusion layer in the semiconductor substrate.

31. A semiconductor device according to claim 30, further comprising side-wall films provided on sides of the control gate electrode.

32. A semiconductor device according to claim 30, wherein the non-volatile memory cell is operated on the second operating voltage.

33. A semiconductor device according to claim 31, wherein the dielectric film has a third contact hole reaching the diffusion layer of the non-volatile memory cell and a width defined between the control gate electrode and the third contact hole is less than that defined between the gate electrode of the second transistor and the second contact hole.

34. A semiconductor device according to claim 33, wherein the third contact hole overlaps the side-wall film of the non-volatile memory cell.

35. A semiconductor device according to claim 31, further comprising a cap insulating film provided on the control gate electrode, and having an etching rate substantially equal to that of the side-wall films of the non-volatile memory cell.

36. A semiconductor device according to claim 35, wherein the cap insulating film and the side-wall films of the non-volatile memory cell are silicon nitride films.

37. A semiconductor device according to claim 21, further comprising:

first and second non-volatile memory cells, each having a floating gate electrode and a control gate electrode on the semiconductor substrate; and a diffusion layer provided in a part of the semiconductor substrate which lies between the control gate electrodes of the first and second non-volatile memory cells, and having a width which is greater when the diffusion layer is a drain diffusion layer than when the diffusion layer is a source diffusion layer, in which case, the source diffusion layer covers a third side-wall film.

38. A semiconductor device according to claim 37, wherein the first and second non-volatile memory cells are memory cells of a NOR type flash memory.

39. A semiconductor device according to claim 21, further comprising:

non-volatile memory cells in series, each having a floating gate electrode and a control gate electrode on the semiconductor substrate;

diffusion layers provided in parts of the semiconductor substrate which lie between the control gate electrodes of the non-volatile memory cells;

side-wall films provided on sides of the control gate electrodes of the non-volatile memory cells and completely covering the diffusion layers, and the side-wall films of the first and second transistors and the non-volatile memory cells being comprised of same materials; and wherein the non-volatile memory cells are memory cells of a NAND type flash memory.

40. A semiconductor device according to claim 39, further comprising:

a select gate transistor having a select gate electrode and a diffusion layer, and connecting the non-volatile memory cells;

side-wall films provided on sides of the select gate electrode, the side-wall films of the first and second transistors and the select gate transistor being comprised of same materials; and wherein the dielectric film has a contact hole reaching the diffusion layer of the select gate transistor.

41. A semiconductor device according to claim 40, wherein the contact hole overlaps the side-wall films of the select gate transistor.

* * * * *